US007790346B2

(12) United States Patent
Irita

(10) Patent No.: US 7,790,346 B2
(45) Date of Patent: *Sep. 7, 2010

(54) HEAT-SENSITIVE TRANSFER IMAGE-RECEIVING SHEET AND IMAGE-FORMING METHOD

(75) Inventor: Kiyoshi Irita, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/819,587

(22) Filed: Jun. 28, 2007

(65) Prior Publication Data

US 2008/0003520 A1 Jan. 3, 2008

(30) Foreign Application Priority Data

Jun. 30, 2006 (JP) ............................ 2006-182402

(51) Int. Cl.
*G03F 7/00* (2006.01)

(52) U.S. Cl. .................... 430/200; 430/138; 430/270.1

(58) Field of Classification Search ................. 430/201, 430/270.1, 302; 428/32.5; 503/227
See application file for complete search history.

(56) References Cited

U.S. PATENT DOCUMENTS

| | | | | |
|---|---|---|---|---|
| 5,071,823 | A * | 12/1991 | Matsushita et al. | 503/227 |
| 6,372,689 | B1 * | 4/2002 | Kuga et al. | 503/227 |
| 7,223,513 | B2 * | 5/2007 | Nakane et al. | 430/200 |
| 7,485,402 | B2 * | 2/2009 | Arai et al. | 430/201 |
| 2006/0046931 | A1 * | 3/2006 | Nakane et al. | 503/201 |
| 2007/0213220 | A1 * | 9/2007 | Irita et al. | 503/227 |
| 2008/0063817 | A1 * | 3/2008 | Tanaka et al. | 428/32.5 |

FOREIGN PATENT DOCUMENTS

| | | |
|---|---|---|
| JP | 5-8572 | 1/1993 |
| JP | 2541796 | 7/1996 |
| JP | 2726040 | 12/1997 |
| JP | 3226167 | 8/2001 |

* cited by examiner

*Primary Examiner*—Cynthia H Kelly
*Assistant Examiner*—Chanceity N Robinson
(74) *Attorney, Agent, or Firm*—Sughrue Mion, PLLC

(57) ABSTRACT

A heat-sensitive transfer image-receiving sheet, containing;
a support;
at least one receptor layer on a support;
at least one heat insulation layer containing hollow latex polymer particles, said at least one heat insulation layer being provided between the support and the at least one receptor layer; and
wherein the hollow polymer particles have a particle diameter distribution that a sum of the number of particles having diameters of at most 90% of an average diameter of the hollow polymer particles and the number of particles having diameters of at least 110% of the average diameter is at least 40% of the total number of the hollow polymer particles present in the heat insulation layer.

15 Claims, No Drawings

HEAT-SENSITIVE TRANSFER IMAGE-RECEIVING SHEET AND IMAGE-FORMING METHOD

FIELD OF THE INVENTION

The present invention relates to a heat-sensitive transfer image-receiving sheet and an image-forming method

BACKGROUND OF THE INVENTION

Various heat transfer recording methods have been known so far. Among these methods, dye diffusion transfer recording systems attract attention as a process that can produce a color hard copy having an image quality closest to that of silver salt photography (see, for example, "Joho Kiroku (Hard Copy) to Sono Zairyo no Shintenkai (Information Recording (Hard Copy) and New Development of Recording Materials)" published by Toray Research Center Inc., 1993, pp. 241-285; and "Printer Zairyo no Kaihatsu (Development of Printer Materials)" published by CMC Publishing Co., Ltd., 1995, p. 180). Moreover, this system has advantages over silver salt photography: it is a dry system, it enables direct visualization from digital data, it makes reproduction simple, and the like.

In this dye diffusion transfer recording system, a heat-sensitive transfer sheet (hereinafter also referred to as an ink sheet) containing dyes is superposed on a heat-sensitive transfer image-receiving sheet (hereinafter also referred to as an image-receiving sheet), and then the ink sheet is heated by a thermal head whose exothermic action is controlled by electric signals, in order to transfer the dyes contained in the ink sheet to the image-receiving sheet, thereby recording an image information. Three colors: cyan, magenta, and yellow, are used for recording a color image by overlapping one color to other, thereby enabling transferring and recording a color image having continuous gradation for color densities.

In such a recording method in dye diffusion transfer system, it has been known that it is important to make the image-receiving sheet have high heat insulation and cushion characteristics in order to give a favorable image (see, for example, "Joho Kiroku (Hard Copy) to Sono Zairyo no Shintenkai (Information Recording (Hard Copy) and New Development of Recording Materials)" published by Toray Research Center Inc., 1993, pp. 241-285 and "Printer Zairyo no Kaihatsu (Development of Printer Materials)" published by CMC Publishing Co., Ltd., 1995, p. 180).

Thus, in some cases, a composite support using a biaxial oriented (stretched) polyolefin film containing microvoids was used as a base material for the image-receiving sheet to make the sheet have more heat insulation and cushion characteristics (see, for example, U.S. Pat. No. 866,282 and JP-A-3-268998 ("JP-A" means unexamined published Japanese patent application)). However in this method, there was occasionally caused a problem that the image-receiving sheet was wrinkled or curled by shrinkage due to relaxation of the residual stress after stretching by the heat during printing or the heat during formation of the image-receiving layer.

As other known methods of making the image-receiving sheet show heat insulation and cushion properties, a method in which, for example, a foaming layer composed of a resin and a foaming agent (see, e.g., Japanese Patent No. 2541796) or a porous layer containing hollow polymer particles (see, e.g., Japanese Patent No. 2726040) each having high cushion characteristics is formed between the support and the receptor layer, is known. The methods have an advantage that it is possible to prevent the image-receiving sheet from wrinkling and curling that are often found in the method in which a composite support made of a biaxial oriented biaxially-oriented polyolefin film containing microvoids is used, because a heat-insulating layer can be formed on a base material by coating according to the method. However, it is generally difficult to produce a uniform smooth image-receiving sheet often causing problems such as bad image-transfer.

To solve the problems described above, an image-receiving sheet having a heat insulation layer made of hollow polymer particles and an organic solvent-resistant polymer as principal components is disclosed (see, e.g., Japanese Patent No. 3226167). However, the image-receiving sheet has not met a sufficient level. In addition, a method in which a solution for forming an intermediate layer is coated on a sheet-shaped base material and an image-receiving sheet is formed while pressing the coated face to a cast drum in forming an intermediate layer of a resin containing hollow particles as the principal component on the sheet-shaped base material, is disclosed (see, e.g., JP-A-5-8572). However, although such a method is effective in giving sufficient smoothness, it makes the production process more complicated and is thus disadvantageous from the viewpoint of productivity.

In addition, the method of forming a layer containing a hollow polymer particles between the support and the receptor layer described above often causes image defects by remaining of transport roller imprints since it generally fails to provide an adequate cushion effect, a heat insulation layer deformed by physical pressure is hard to restore to its normal condition, as compared to the method of using a composite support employing a biaxially-oriented polyolefin film containing microvoids.

SUMMARY OF THE INVENTION

The present invention resides in a heat-sensitive transfer image-receiving sheet, comprising;

a support;

at least one receptor layer on a support;

at least one heat insulation layer containing hollow polymer particles, said at least one heat insulation layer being provided between the support and the at least one receptor layer; and wherein the hollow polymer particles have a particle diameter distribution that a sum of the number of particles having diameters of 90% or less of an average diameter of the hollow polymer particles and the number of particles having diameters of 110% or more of the average diameter is at least 40% of the total number of the hollow polymer particles present in the heat insulation layer.

Furthermore, the present invention resides in a method of forming an image, which method comprises the steps of:

superposing the heat-sensitive transfer image-receiving sheet upon a transfer material comprising a solid-phase ink layer, and applying a thermal energy from a thermal head of a thermal transfer printer, and forming an image on the receptor layer in the heat-sensitive transfer image-receiving sheet.

Other and further features and advantages of the invention will appear more fully from the following description.

DETAILED DESCRIPTION OF THE INVENTION

According to the present invention, there is provided the following means:

(1) A heat-sensitive transfer image-receiving sheet, comprising;

a support;

at least one receptor layer on a support;

at least one heat insulation layer containing hollow latex polymer particles, said at least one heat insulation layer being provided between the support and the at least one receptor layer; and wherein the hollow polymer particles have a particle diameter distribution that a sum of the number of particles having diameters of 90% or less of an average diameter of the hollow polymer particles and the number of particles having diameters of 110% or more of the average diameter is at least 40% of the total number of the hollow polymer particles present in the heat insulation layer.

(2) The heat-sensitive transfer image-receiving sheet according to the item (1), wherein the hollow polymer particles is a non-foaming type hollow particles obtained in the following manner: a dispersion medium is contained inside of a capsule wall and, after a coating solution is applied and dried, the dispersion medium in the particles is vaporized out of the particles, so that the inside of each particle forms a hollow.

(3) The heat-sensitive transfer image-receiving sheet according to the item (1), in which the average diameter of the hollow polymer particles is from 0.3 to 1.5 μm.

(4) The heat-sensitive transfer image-receiving sheet according to the item (1), wherein the heat insulation layer further contains a water-soluble polymer.

(5) The heat-sensitive transfer image-receiving sheet according to the item (4), wherein the water-soluble polymer is a gelatin and/or a polyvinyl alcohol.

(6) The heat-sensitive transfer image-receiving sheet according to the item (1), in which the heat insulation layer has a hollow polymer content of 65 mass % or more.

(7) The heat-sensitive transfer image-receiving sheet according to the item (1), in which the average diameter of the hollow polymer particles is from 0.45 to 1.5 μm.

(8) The heat-sensitive transfer image-receiving sheet according to the item (1), wherein the receptor layer further contains at least one kind of polymer having repeating units derived from vinyl chloride.

(9) The heat-sensitive transfer image-receiving sheet according to the item (1), wherein the heat insulation layer is formed on the support by a water-based coating method.

(10) The heat-sensitive transfer image-receiving sheet according to the item (9), wherein the receptor layer and the heat insulation layer are applied by a simultaneous multilayer coating.

(11) The heat-sensitive transfer image-receiving sheet according to the item (1), wherein the support comprises a base paper (base sheet) and a polyolefin resin layer that is provided on both side or at least on the side of the base paper to which the receptor layer is provided.

(12) A method of forming an image, which method comprises the steps of:

superposing the heat-sensitive transfer image-receiving sheet according to the item (1) upon a transfer material comprising a solid-phase ink layer, and applying a thermal energy from a thermal head of a thermal transfer printer, and forming an image on the receptor layer in the heat-sensitive transfer image-receiving sheet.

After intensive studies, the inventor has found that the aforesaid problems can be solved by use of hollow polymer particles having specified particle diameters and a specified distribution of such particle diameters. The present invention was made based on the finding.

The heat-sensitive transfer image-receiving sheet (image-receiving sheet) of the present invention is explained below.

The heat-sensitive transfer image-receiving sheet of the present invention is provided with at least one heat insulation layer and at least one dye-receiving layer (receptor layer) on a support, in increasing order of distance from the support.

It is preferable to form an undercoat layer between the receptor layer and the support. As the undercoat layer, for example, a white background control layer, a charge control layer, an adhesive layer and a primer layer can be formed. Further, a releasing layer can be formed on the most outer layer of a surface to be superposed with the transfer material. It is preferable that a curling control layer, a writing layer, or a charge-control layer be formed on the backside of the support. Each of these layers is applied using a usual method such as a roll coating, a bar coating, a gravure coating, a gravure reverse coating, a dye coating, a slide coating and a curtain coating. In practicing the present invention, a method capable of conducting a simultaneous multi-layer coating, such as the slide coating and the curtain coating, is preferable.

The receptor layer, the heat insulation layer, and the other layer may be formed separately, or any layers may be formed by a simultaneous multilayer coating, but the layers on the same face are preferably formed by a simultaneous multilayer coating.

(Receptor Layer)

The receptor layer performs functions of receiving dyes transferred from an ink sheet and retaining images formed. The image-receiving sheet of the present invention has at least one receptor layer preferably containing at least one thermoplastic receiving polymer that can receive a dye.

The receiving polymer is preferably used, as it is dispersed in a water-soluble dispersion medium as a latex polymer. In addition, the receptor layer preferably contains a water-soluble polymer together with the latex polymer. Co-presence of the latex polymer and the water-soluble polymer allows presence of the water-soluble polymer, which is hardly dyable, among the latex polymers and prevents diffusion of the dye fixed on the latex polymer, and consequently, reduces changes in the color sharpness of the receptor layer with the lapse of time and forms a recorded image smaller in changes for its transferred image quality with the lapse of time.

The receptor layer may contain, in addition to the latex polymer of the receiving polymer, another latex polymer having a different function, for example, for the purpose of adjusting the elastic modulus of the film.

<Latex Polymer>

The latex polymer used in the heat-sensitive transfer image-receiving sheet of the present invention is explained.

In the heat-sensitive transfer image-receiving sheet of the present invention, the latex polymer used in the receptor layer is a dispersion in which water-insoluble hydrophobic polymers are dispersed as fine particles in a water-soluble dispersion medium.

To the extent of using at least one thermoplastic receiving polymer that can receive a dye transferred from a transfer material, the latex polymer is not particularly limited. Multiple kinds of different latex polymers may be used in combination as the latex polymer, but the latex polymer for use in the present invention is preferably at least one latex copolymer containing at least vinyl chloride unit, i.e., a copolymer having repeating units derived from vinyl chloride.

The dispersed state may be one in which polymer is emulsified in a dispersion medium, one in which polymer underwent emulsion polymerization, one in which polymer underwent micelle dispersion, one in which polymer molecules partially have a hydrophilic structure and thus the molecular chains themselves are dispersed in a molecular state, or the like. Latex polymers are described in "Gosei Jushi Emulsion (Synthetic Resin Emulsion)", compiled by Taira Okuda and Hiroshi Inagaki, issued by Kobunshi Kanko Kai (1978); "Gosei Latex no Oyo (Application of Synthetic Latex)", compiled by Takaaki Sugimura, Yasuo Kataoka, Souichi Suzuki, and Keishi Kasahara, issued by Kobunshi Kanko Kai (1993); Soichi Muroi, "Gosei Latex no Kagaku (Chemistry of Synthetic Latex)", issued by Kobunshi Kanko Kai (1970); Yoshiaki Miyosawa (supervisor) "Suisei Coating-Zairyo no Kaihatsu to Oyo (Development and Application of Aqueous Coating Material)", issued by CMC Publishing Co., Ltd. (2004) and JP-A-64-538, and so forth.

The average diameter of the dispersed particles is preferably in the range of approximately 1 to 50,000 nm, more preferably 5 to 1,000 nm.

The particle diameter distribution of the dispersed particles is not particularly limited, and thus, the particles may have a wide particle diameter distribution or a monodispersion-like particle diameter distribution.

The latex polymer for use in the present invention may be latex of the so-called core/shell type, other than ordinary latex polymer of a uniform structure. When using a core/shell type latex polymer, it is preferred in some cases that the core and the shell have different glass transition temperatures. The glass transition temperature (Tg) of the latex polymer for use in the present invention is preferably −30° C. to 100° C., more preferably 0° C. to 80° C., further more preferably 10° C. to 70° C., and especially preferably 15° C. to 60° C.

The glass transition temperature (Tg) is calculated according to the following equation:

$$1/Tg=\Sigma(Xi/Tgi)$$

wherein, assuming that the polymer is a copolymer composed of n monomers from i=1 to i=n, Xi is a weight fraction of the i-th monomer ($\Sigma Xi=1$) and Tgi is glass transition temperature (measured in absolute temperature) of a homopolymer formed from the i-th monomer. The symbol Σ means the sum of i=1 to i=n. The value of the glass transition temperature of a homopolymer formed from each monomer (Tgi) is adopted from J. Brandrup and E. H. Immergut, "Polymer Handbook, 3rd. Edition", Wiley-Interscience (1989).

In the receptor layer of the present invention, as a preferable embodiment of the latex polymer comprising repeating units derived from vinyl chloride, there can be preferably used polyvinyl chlorides, a copolymer comprising vinyl chloride unit, such as a vinyl chloride-vinyl acetate copolymer and a vinyl chloride acrylate copolymer. In case of the copolymer, the vinyl chloride unit in molar ratio is preferably in the range of from 50% to 95%. These polymers may be straight-chain, branched, or cross-linked polymers, the so-called homopolymers obtained by polymerizing single type of monomers, or copolymers obtained by polymerizing two or more types of monomers. In the case of the copolymers, these copolymers may be either random copolymers or block copolymers. The molecular weight of each of these polymers is preferably 5,000 to 1,000,000, and further preferably 10,000 to 500,000 in terms of number average molecular weight. Polymers having excessively small molecular weight impart insufficient dynamic strength to the layer containing the latex, and polymers having excessively large molecular weight bring about poor filming ability, and therefore both cases are not preferable. Crosslinkable latex polymers are also preferably used.

The latex polymer comprising repeating units derived from vinyl chloride that can be used in the present invention is commercially available, and polymers described below may be utilized. Examples thereof include G351 and G576 (trade names, manufactured by Nippon Zeon Co., Ltd.); VINYBLAN 240, 270, 277, 375, 386, 609, 550, 601, 602, 630, 660, 671, 683, 680, 680S, 681N, 685R, 277, 380, 381, 410, 430, 432, 860, 863, 865, 867, 900, 900GT, 938 and 950 (trade names, manufactured by Nissin Chemical Industry Co., Ltd.).

The latex polymer in the other structure that can be used in combination with the latex polymer comprising vinyl chloride unit is not particularly limited, but hydrophobic polymers such as acrylic-series polymers, polyesters, rubbers (e.g., SBR resins), polyurethanes, polyvinyl chlorides, polyvinyl acetates, polyvinylidene chlorides, and polyolefins, are preferably used. These polymers may be straight-chain, branched, or cross-linked polymers, the so-called homopolymers obtained by polymerizing single type of monomers, or copolymers obtained by polymerizing two or more types of monomers. In the case of the copolymers, these copolymers may be either random copolymers or block copolymers. The molecular weight of each of these polymers is preferably 5,000 to 1,000,000, and further preferably 10,000 to 500,000 in terms of number average molecular weight. A polymer having an excessively small molecular weight imparts insufficient dynamic strength to a layer containing a latex of the polymer, and a polymer having an excessively large molecular weight brings about poor filming ability, and therefore both cases are not preferable. Crosslinkable latex polymers are also preferably used.

No particular limitation is imposed on a monomer to be used in synthesizing the latex polymer having the other structure that can be used in combination with the above-described latex polymer in the present invention, and the following monomer groups (a) to (j) may be preferably used as those polymerizable in a usual radical polymerization or ion polymerization method. These monomers may be selected singly or combined freely to synthesize the latex polymer.

—Monomer Groups (a) to (j)—

(a) Conjugated dienes: 1,3-pentadiene, isoprene, 1-phenyl-1,3-butadiene, 1-α-naphthyl-1,3-butadiene, 1-β-naphthyl-1,3-butadiene, cyclopentadiene, etc.

(b) Olefins: ethylene, propylene, vinyl chloride, vinylidene chloride, 6-hydroxy-1-hexene, 4-pentenoic acid, methyl 8-nonenate, vinylsulfonic acid, trimethylvinylsilane, trimethoxyvinylsilane, 1,4-divinylcyclohexane, 1,2,5-trivinylcyclohexane, etc.

(c) α,β-unsaturated carboxylates: alkyl acrylates, such as methyl acrylate, ethyl acrylate, butyl acrylate, cyclohexyl acrylate, 2-ethylhexyl acrylate, and dodecyl acrylate; substituted alkyl acrylates, such as 2-chloroethyl acrylate, benzyl acrylate, and 2-cyanoethyl acrylate; alkyl methacrylates, such as methyl methacrylate, butyl methacrylate, 2-ethylhexyl methacrylate, and dodecyl methacrylate; substituted alkyl methacrylates, such as 2-hydroxyethyl methacrylate, glycidyl methacrylate, glycerin monomethacrylate, 2-acetoxyethyl methacrylate, tetrahydrofurfuryl methacrylate, 2-methoxyethyl methacrylate, polypropylene glycol monomethacrylates (mole number of added polyoxypropylene=2 to 100), 3-N,N-dimethylaminopropyl methacrylate, chloro-3-N,N,N-trimethylammoniopropyl methacrylate, 2-carboxyethyl methacrylate, 3-sulfopropyl methacrylate, 4-oxysulfobutyl methacrylate, 3-trimethoxysilylpropyl methacrylate, allyl methacrylate, and 2-isocyanatoethyl methacrylate; derivatives of unsaturated dicarboxylic acids, such as monobutyl maleate, dimethyl maleate, monomethyl itaconate, and dibutyl itaconate; multifunctional esters, such as ethylene glycol diacrylate, ethylene glycol dimethacrylate, 1,4-cyclohexane diacrylate, pentaerythritol tetramethacrylate, pentaerythritol triacrylate, trimethylolpropane triacrylate, triimethylolethane triacrylate, dipentaerythritol pentamethacrylate, pentaerythritol hexaacrylate, and 1,2,4-cyclohexane tetramethacrylate; etc.

(d) α,β-unsaturated carboxylic amides: acrylamide, methacrylamide, N-methylacrylamide, N,N-dimethylacrylamide, N-methyl-N-hydroxyethylmethacrylamide, N-tert-butylacrylamide, N-tert-octylmethacrylamide, N-cyclohexylacrylamide, N-phenylacrylamide, N-(2-acetoacetoxyethyl)acrylamide, N-acryloylmorpholine, diacetone acrylamide, itaconic diamide, N-methylmaleimide, 2-acrylamide-methylpropane sulfonic acid, methylenebisacrylamide, dimethacryloylpiperazine, etc.

(e) Unsaturated nitriles: acrylonitrile, methacrylonitrile, etc.

(f) Styrene and derivatives thereof: styrene, vinyltoluene, p-tert-butylstyrene, vinylbenzoic acid, methyl vinylbenzoate, α-methylstyrene, p-chloromethylstyrene, vinylnaphthalene, p-hydroxymethylstyrene, sodium p-styrenesulfonate, potassium p-styrenesulfinate, p-aminomethylstyrene, 1,4-divinylbenzene, etc.

(g) Vinyl ethers: methyl vinyl ether, butyl vinyl ether, methoxyethyl vinyl ether, etc.

(h) Vinyl esters: vinyl acetate, vinyl propionate, vinyl benzoate, vinyl salicylate, vinyl chloroacetate, etc.

(i) α,β-unsaturated carboxylic acids and salts thereof: acrylic acid, methacrylic acid, itaconic acid, maleic acid, sodium acrylate, ammonium methacrylate, potassium itaconate, etc.

(j) Other polymerizable monomers: N-vinylimidazole, 4-vinylpyridine, N-vinylpyrrolidone, 2-vinyloxazoline, 2-isopropenyloxazoline, divinylsulfone, etc.

Latex polymers that can be used in combination are also commercially available, and polymers described below may be utilized.

Examples of the acrylic-series polymers include Cevian A-4635, 4718, and 4601 (trade names, manufactured by Daicel Chemical Industries); Nipol Lx811, 814, 821, 820, 855 (P-17: Tg 36° C.), and 857×2 (P-18: Tg 43° C.) (trade names, manufactured by Nippon Zeon Co., Ltd.); Voncoat R3370 (P-19: Tg 25° C.), and 4280 (P-20: Tg 15° C.) (trade names, manufactured by Dai-Nippon Ink & Chemicals, Inc.); Julimer ET-410 (P-21: Tg 44° C.) (trade name, manufactured by Nihon Junyaku K.K.); AE116 (P-22: Tg 50° C.), AE119 (P-23: Tg 55° C.), AE121 (P-24: Tg 58° C.), AE125 (P-25: Tg 60° C.), AE134 (P-26: Tg 48° C.), AE137 (P-27: Tg 48° C.), AE140 (P-28: Tg 53° C.), and AE173 (P-29: Tg 60° C.) (trade names, manufactured by JSR Corporation); Aron A-104 (P-30: Tg 45° C.) (trade name, manufactured by Toagosei Co., Ltd.); NS-600×, and NS-620X (trade names, manufactured by Takamatsu Yushi K.K.); VINYBLAN 2580, 2583, 2641, 2770, 2770H, 2635, 2886, 5202C, and 2706 (trade names, manufactured by Nissin Chemical Industry Co., Ltd.).

Examples of the polyesters include FINETEX ES650, 611, 675, and 850 (trade names, manufactured by Dainippon Ink and Chemicals, Incorporated); WD-size, and WMS (trade names, manufactured by Eastman Chemical Ltd.); A-110, A-115GE, A-120, A-121, A-124GP, A-124S, A-160P, A-210, A-215GE, A-510, A-513E, A-515GE, A-520, A-610, A-613, A-615GE, A-620, WAC-10, WAC-15, WAC-17XC, WAC-20, S-110, S-110EA, S-111 SL, S-120, S-140, S-140A, S-250, S-252G, S-250S, S-320, S-680, DNS-63P, NS-122L, NS-122LX, NS-244LX, NS-140L, NS-141LX, and NS-282LX (trade names, manufactured by Takamatsu Yushi K.K.); Aronmelt PES-1000 series, and PES-2000 series (trade names, manufactured by Toagosei Co., Ltd.); Bironal MD-1100, MD-1200, MD-1220, MD-1245, MD-1250, MD-1335, MD-1400, MD-1480, MD-1500, MD-1930, and MD-1985 (trade names, manufactured by Toyobo Co., Ltd.); and Ceporjon ES (trade name, manufactured by Sumitomo Seika Chemicals Co., Ltd.).

Examples of the polyurethanes include HYDRAN AP10, AP20, AP30, AP40, and 101H, Vondic 1320NS and 1610NS (trade names, manufactured by Dainippon Ink and Chemicals, Incorporated); D-1000, D-2000, D-6000, D-4000, and D-9000 (trade names, manufactured by Dainichi Seika Color & Chemicals Mfg. Co., Ltd.); NS-155X, NS-310A, NS-310X, and NS-311X (trade names, manufactured by Takamatsu Yushi K.K.); Elastron (trade name, manufactured by Dai-ichi Kogyo Seiyaku Co., Ltd.).

Examples of the rubbers include LACSTAR 7310K, 3307B, 4700H, and 7132C (trade names, manufactured by Dainippon Ink & Chemicals Incorporated); Nipol Lx416, LX410, LX430, LX435, LX110, LX415A, LX438C, 2507H, LX303A, LX407BP series, V1004, and MH5055 (trade names, manufactured by Nippon Zeon Co., Ltd.).

Examples of the polyolefins include Chemipearl S120, SA100, and V300 (P-40: Tg 80° C.) (trade names, manufactured by Mitsui Petrochemical); Voncoat 2830, 2210, and 2960 (trade names, manufactured by Dainippon Ink and Chemicals, Incorporated); Zaikusen and Ceporjon G (trade names, manufactured by Sumitomo Seika Chemicals Co., Ltd.).

Examples of the copolymer nylons include Ceporjon PA (trade name, manufactured by Sumitomo Seika Chemicals Co., Ltd.).

Examples of the polyvinyl acetates include VINYBLAN 1080, 1082, 1085W, 1108W, 1108S, 1563M, 1566, 1570, 1588C, A22J7-F2, 1128C, 1137, 1138, A20J2, A23J1, A23J1, A23K1, A23P2E, A68J1N, 1086A, 1086, 1086D, 1108S, 1187, 1241LT, 1580N, 1083, 1571, 1572, 1581, 4465, 4466, 4468W, 4468S, 4470, 4485LL, 4495LL, 1023, 1042, 1060, 1060S, 1080M, 1084W, 1084S, 1096, 1570K, 1050, 1050S, 3290, 1017AD, 1002, 1006, 1008, 1107L, 1225, 1245L, GV-6170, GV-6181, 4468W, and 4468S (trade names, manufactured by Nisshin Chemical Industry Co., Ltd.).

These latex polymers may be used singly, or two or more of these polymers may be blended, if necessary.

In the receptor layer for use in the present invention, a ratio of the latex polymer comprising a component of vinyl chloride is preferably 50 mass % or more of the whole solid content in the layer.

The glass transition temperature (Tg) of the latex polymer having the other structure that can be used in combination with the latex polymer comprising vinyl chloride unit is preferably in the range of −30° C. to 70° C., more preferably −10° C. to 50° C., still more preferably 0° C. to 40° C., in view of film-forming properties (brittleness for working) and image preservability. A blend of two or more types of polymers can be used as the binder. When a blend of two or more polymers is used, the average Tg obtained by summing up the Tg of each polymer weighted by its proportion, is preferably within the foregoing range. Also, when phase separation occurs or when a core-shell structure is adopted, the weighted average Tg is preferably within the foregoing range.

The latex polymer for use in the present invention preferably has a minimum film-forming temperature (MFT) of from −30 to 90° C., more preferably from 0 to 70° C. In order to control the minimum film-forming temperature, a film-forming aid may be added. The film-forming aid is also called a temporary plasticizer, and it is an organic compound (usually an organic solvent) that reduces the minimum film-forming temperature of a latex polymer. It is described in, for example, Souichi Muroi, "Gosei Latex no Kagaku (Chemistry of Synthetic Latex)", issued by Kobunshi Kanko Kai (1970). Preferable examples of the film-forming aid are listed below, but the compounds that can be used in the present invention are not limited to the following specific examples.

Z-1: Benzyl alcohol

Z-2: 2,2,4-Trimethylpentanediol-1,3-monoisobutyrate

Z-3: 2-Dimethylaminoethanol

Z-4: Diethylene glycol

The latex polymer for use in the present invention can be easily obtained by a solution polymerization method, a suspension polymerization method, an emulsion polymerization method, a dispersion polymerization method, an anionic polymerization method, a cationic polymerization method, or the like. Above all, an emulsion polymerization method in which the polymer is obtained as a latex is the most preferable. Also, a method is preferable in which the polymer is prepared in a solution, and the solution is neutralized, or an emulsifier is added to the solution, to which water is then added, to prepare an aqueous dispersion by forced stirring. For example, an emulsion polymerization method comprises conducting polymerization under stirring at about 30° C. to about 100° C. (preferably 60° C. to 90° C.) for 3 to 24 hours by using water or a mixed solvent of water and a water-miscible organic solvent (such as methanol, ethanol, or acetone) as a dispersion medium, a monomer mixture in an amount of 5 mass % to 150 mass % based on the amount of the dispersion medium, an emulsifier and a polymerization initiator. Various conditions such as the dispersion medium, the monomer concentration, the amount of initiator, the amount of emulsifier, the amount of dispersant, the reaction temperature, and the method for adding monomers are suitably determined considering the type of the monomers to be used. Furthermore, it is preferable to use a dispersant when necessary.

Generally, the emulsion polymerization method can be conducted according to the disclosures of the following documents: "Gosei Jushi Emarujon (Synthetic Resin Emulsions)" (edited by Taira Okuda and Hiroshi Inagaki and published by Kobunshi Kankokai (1978)); "Gosei Ratekkusu no Oyo (Applications of Synthetic Latexes)" (edited by Takaaki Sugimura, Yasuo Kataoka, Soichi Suzuki, and Keiji Kasahara and published by Kobunshi Kankokai (1993)); and "Gosei Ratekkusu no Kagaku (Chemistry of Synthetic Latexes)" (edited by Soichi Muroi and published by Kobunshi Kankokai (1970)). The emulsion polymerization method for synthesizing the latex polymer for use in the present invention may be a batch polymerization method, a monomer (continuous or divided) addition method, an emulsion addition method, or a seed polymerization method. The emulsion polymerization method is preferably a batch polymerization method, a monomer (continuous or divided) addition method, or an emulsion addition method in view of the productivity of latex.

The polymerization initiator may be any polymerization initiator having radical generating ability. The polymerization initiator to be used may be selected from inorganic peroxides such as persulfates and hydrogen peroxide, peroxides described in the organic peroxide catalogue of NOF Corporation, and azo compounds as described in the azo polymerization initiator catalogue of Wako Pure Chemical Industries, Ltd. Among them, water-soluble peroxides such as persulfates and water-soluble azo compounds as described in the azo polymerization initiator catalogue of Wako Pure Chemical Industries, Ltd. are preferable; ammonium persulfate, sodium persulfate, potassium persulfate, azobis(2-methylpropionamidine) hydrochloride, azobis(2-methyl-N-(2-hydroxyethyl)propionamide), and azobiscyanovaleric acid are more preferable; and peroxides such as ammonium persulfate, sodium persulfate, and potassium persulfate are especially preferable from the viewpoints of image preservability, solubility, and cost.

The amount of the polymerization initiator to be added is, based on the total amount of monomers, preferably 0.3 mass % to 2.0 mass %, more preferably 0.4 mass % to 1.75 mass %, and especially preferably 0.5 mass % to 1.5 mass %.

The polymerization emulsifier to be used may be selected from anionic surfactants, nonionic surfactants, cationic surfactants, and ampholytic surfactants. Among them, anionic surfactants are preferable from the viewpoints of dispersibility and image preservability. Sulfonic acid type anionic surfactants are more preferable because polymerization stability can be ensured even with a small addition amount and they have resistance to hydrolysis. Long chain alkyldiphenyl ether disulfonic acid salts (whose typical example is PELEX SS-H (trade name) manufactured by Kao Corporation,) are still more preferable, and low electrolyte types such as PIONIN A-43-S (trade name, manufactured by Takemoto Oil & Fat Co., Ltd.) are especially preferable.

The amount of sulfonic acid type anionic surfactant as the polymerization emulsifier is preferably 0.1 mass % to 10.0 mass %, more preferably 0.2 mass % to 7.5 mass %, and especially preferably 0.3 mass % to 5.0 mass %, based on the total amount of monomers.

It is preferable to use a chelating agent in synthesizing the latex polymer to be used in the present invention. The chelating agent is a compound capable of coordinating (chelating) a polyvalent ion such as metal ion (e.g., iron ion) or alkaline earth metal ion (e.g., calcium ion), and examples of the chelate compound which can be used include the compounds described in JP-B-6-8956 ("JP-B" means examined Japanese patent publication), U.S. Pat. No. 5,053,322, JP-A-4-73645, JP-A-4-127145, JP-A-4-247073, JP-A-4-305572, JP-A-6-11805, JP-A-5-173312, JP-A-5-66527, JP-A-5-158195, JP-A-6-118580, JP-A-6-110168, JP-A-6-161054, JP-A-6-175299, JP-A-6-214352, JP-A-7-114161, JP-A-7-114154, JP-A-7-120894, JP-A-7-199433, JP-A-7-306504, JP-A-9-43792, JP-A-8-314090, JP-A-10-182571, JP-A-10-182570, and JP-A-1-190892.

Preferred examples of the chelating agent include inorganic chelate compounds (e.g., sodium tripolyphosphate, sodium hexametaphosphate, sodium tetrapolyphosphate), aminopolycarboxylic acid-based chelate compounds (e.g., nitrilotriacetic acid, ethylenediaminetetraacetic acid), organic phosphonic acid-based chelate compounds (e.g., compounds described in Research Disclosure, No. 18170, JP-A-52-102726, JP-A-53-42730, JP-A-56-97347, JP-A-54-121127, JP-A-55-4024, JP-A-55-4025, JP-A-55-29883, JP-A-55-126241, JP-A-55-65955, JP-A-55-65956, JP-A-57-179843, JP-A-54-61125, and West German Patent No. 1045373), polyphenol-based chelating agents, and polyamine-based chelate compounds, with aminopolycarboxylic acid derivatives being particularly preferred.

Preferred examples of the aminopolycarboxylic acid derivative include the compounds shown in the Table attached to "EDTA (—Complexane no Kagaku—) (EDTA—Chemistry of Complexane—)", Nankodo (1977). In these compounds, a part of the carboxyl groups may be substituted by an alkali metal salt such as sodium or potassium or by an ammonium salt. More preferred examples of the aminopolycarboxylic acid derivative include iminodiacetic acid, N-methyliminodiacetic acid, N-(2-aminoethyl)iminodiacetic acid, N-(carbamoylmethyl)iminodiacetic acid, nitrilotriacetic acid, ethylenediamine-N,N'-diacetic acid, ethylenediamine-N,N'-di-a-propionic acid, ethylenediamine-N,N'-di-β-propionic acid, N,N'-ethylene-bis(α-o-hydroxyphenyl)glycine, N,N'-di(2-hydroxybenzyl)ethylenediamine-N,N'-diacetic acid, ethylenediamine-N,N'-diacetic acid-N,N'-diacetohydroxamic acid, N-hydroxyethylethylenediamine-N,N',N'-triacetic acid, ethylenediamine-N,N,N',N'-tetraacetic acid, 1,2-propylenediamine-N,N,N',N'-tetraacetic acid, d,1-2,3-diaminobutane-N,N,N',N'-tetraacetic acid, meso-2,3-diaminobutane-N,N,N',N'-tetraacetic acid, 1-phenylethylenediamine-N,N,N',N'-tetraacetic acid, d,1-1,2-diphenylethylenediamine-N,N,N',N'-tetraacetic acid, 1,4-diaminobutane-N,N,N',N'-tetraacetic acid, trans-cyclobutane-1,2-diamine-N,N,N',N'-tetraacetic acid, trans-cyclopentane-1,2-diamine-N,N,N',N'-tetraacetic acid, trans-cyclohexane-1,2-diamine-N,N,N',N'-tetraacetic acid, cis-cyclohexane-1,2-diamine-N,N,N',N'-tetraacetic acid, cyclohexane-1,3-diamine-N,N,N',N'-tetraacetic acid, cyclohexane-1,4-diamine-N,N,N',N'-tetraacetic acid, o-phenylenediamine-N,N,N',N'-tetraacetic acid, cis-1,4-diaminobutene-N,N,N',N'-tetraacetic acid, trans-1,4-diaminobutene-N,N,N',N'-tetraacetic acid, α,α'-diamino-o-xylene-N,N,N',N'-tetraacetic acid, 2-hydroxy-1,3-propanediamine-N,N,N',N'-tetraacetic acid, 2,2'-oxy-bis (ethyliminodiacetic acid), 2,2'-ethylenedioxy-bis (ethyliminodiacetic acid), ethylenedianine-N,N'-diacetic acid-N,N'-di-c-propionic acid, ethylenediamine-N,N'-diacetic acid-N,N'-di-β-propionic acid, ethylenediamine-N,N,N',N'-tetrapropionic acid, diethylenetriamine-N,N,N',N'',N''-pentaacetic acid, triethylenetetramine-N,N,N',N'',N''',N'''-hexaacetic acid, and 1,2,3-triaminopropane-N,N,N',N'',N''',N'''-hexaacetic acid. In these compounds, a part of the carboxyl groups may be substituted by an alkali metal salt such as sodium or potassium or by an ammonium salt.

The amount of the chelating agent to be added is preferably 0.01 mass % to 0.4 mass %, more preferably 0.02 mass % to 0.3 mass %, and especially preferably 0.03 mass % to 0.15 mass %, based on the total amount of monomers. When the addition amount of the chelating agent is too small, metal ions entering during the preparation of the latex polymer are not sufficiently trapped, and the stability of the latex against aggregation is lowered, whereby the coating properties become worse. When the amount is too large, the viscosity of the latex increases, whereby the coating properties are lowered.

In the preparation of the latex polymer to be used in the present invention, it is preferable to use a chain transfer agent. As the chain transfer agent, ones described in Polymer Handbook (3rd Edition) (Wiley-Interscience, 1989) are preferable. Sulfur compounds are more preferable because they have high chain-transfer ability and because the required amount is small. Especially, hydrophobic mercaptane-based chain transfer agents such as tert-dodecylmercaptane and n-dodecylmercaptane are preferable.

The amount of the chain transfer agent to be added is preferably 0.2 mass % to 2.0 mass %, more preferably 0.3 mass % to 1.8 mass %, and especially preferably 0.4 mass % to 1.6 mass %, based on the total amount of monomers.

Besides the foregoing compounds, in the emulsion polymerization, use can be made of additives, such as electrolytes, stabilizers, thickeners, defoaming agents, antioxidants, vulcanizers, antifreezing agents, gelling agents, and vulcanization accelerators, as described, for example, in Synthetic. Rubber Handbook.

In the present invention, it is preferable to prepare the latex polymer by applying an aqueous type coating solution and then drying it. The "aqueous type" so-called here means that 60% by mass or more of the solvent (dispersion medium) of the coating solution is water. As a component other than water in the coating solution, a water miscible organic solvent may be used, such as methyl alcohol, ethyl alcohol, isopropyl alcohol, methyl cellosolve, ethyl cellosolve, dimethylformamide, ethyl acetate, diacetone alcohol, furfuryl alcohol, benzyl alcohol, diethylene glycol monoethyl ether, and oxyethyl phenyl ether.

The latex polymer in the image-receiving sheet of the present invention includes a state of a gel or dried film formed by removing a part of solvents by drying after coating.

<Water-Soluble Polymer>

The receptor layer preferably contains a water-soluble polymer. Herein, "water-soluble polymer" means a polymer which dissolves, in 100 g water at 20° C., in an amount of preferably 0.05 g or more, more preferably 0.1 g or more, further preferably 0.5 g or more, and particularly preferably 1 g or more. The water-soluble polymer which can be used in the present invention is natural polymers (polysaccharide type, microorganism type, and animal type), semi-synthetic polymers (cellulose-based, starch-based, and alginic acid-based), and synthetic polymer type (vinyl type and others); and synthetic polymers including polyvinyl alcohols, and natural or semi-synthetic polymers using celluloses derived from plant as starting materials, which will be explained later, correspond to the water-soluble polymer usable in the present invention. The latex polymers recited above are not included in the water-soluble polymers which can be used in the present invention. In the present invention, the water-soluble polymer is also referred to as a binder, for differentiation from the latex polymer described above.

Among the water-soluble polymers which can be used in the present invention, the natural polymers and the semi-synthetic polymers will be explained in detail. Specific examples include the following polymers: plant type polysaccharides such as gum arabics, κ-carrageenans, τ-carrageenans, λ-carrageenans, guar gums (e.g. Supercol, manufactured by Squalon), locust bean gums, pectins, tragacanths, corn starches (e.g. Purity-21, manufactured by National Starch & Chemical Co.), and phosphorylated starches (e.g. National 78-1898, manufactured by National Starch & Chemical Co.); microbial type polysaccharides such as xanthan gums (e.g. Keltrol T, manufactured by Kelco) and dextrins (e.g. Nadex 360, manufactured by National Starch & Chemical Co.); animal type natural polymers such as gelatins (e.g. Crodyne B419, manufactured by Croda), caseins, sodium chondroitin sulfates (e.g. Cromoist CS, manufactured by Croda); cellulose-based polymers such as ethylcelluloses (e.g. Cellofas WLD, manufactured by I.C.I.), carboxymethylcelluloses (e.g. CMC, manufactured by Daicel), hydroxyethylcelluloses (e.g. HEC, manufactured by Daicel), hydroxypropylcelluloses (e.g. Klucel, manufactured by Aqualon), methylcelluloses (e.g. Viscontran, manufactured by Henkel), nitrocelluloses (e.g. Isopropyl Wet, manufactured by Hercules), and cationated celluloses (e.g. Crodacel QM, manufactured by Croda); starches such as phosphorylated starches (e.g. National 78-1898, manufactured by National Starch & Chemical Co.); alginic acid-based compounds such as sodium alginates (e.g. Keltone, manufactured by Kelco) and propylene glycol alginates; and other polymers such as cationated guar gums (e.g. Hi-care 1000, manufactured by Alcolac) and sodium hyaluronates (e.g. Hyalure, manufactured by Lifecare Biomedial) (all of the names are trade names).

Gelatin is one of preferable embodiments in the present invention. Gelatin having a molecular weight of from 10,000 to 1,000,000 may be used in the present invention. Gelatin that can be used in the present invention may contain an anion such as $Cl^-$ and $SO_4^{2-}$, or alternatively a cation such as $Fe^{2+}$, $Ca^{2+}$, $Mg^{2+}$, $Sn^{2+}$, and $Zn^{2+}$. Gelatin is preferably added as an aqueous solution.

Among the water-soluble polymers which can be used in the present invention, the water-soluble synthetic polymers will be explained in detail. Examples of the acryl type include sodium polyacrylates, polyacrylic acid copolymers, polyacrylamides, polyacrylamide copolymers, and polydiethylaminoethyl(meth)acrylate quaternary salts or their copolymers. Examples of the vinyl type include polyvinylpyrrolidones, polyvinylpyrrolidone copolymers, and polyvinyl alcohols. Examples of the others include polyethylene glycols, polypropylene glycols, polyisopropylacrylamides, polymethyl vinyl ethers, polyethyleneimines, polystyrenesulfonic acids or their copolymers, naphthalenesulfonic acid condensate salts, polyvinylsulfonic acids or their copolymers, polyacrylic acids or their copolymers, acrylic acid or its copolymers, maleic acid copolymers, maleic acid monoester copolymers, acryloylmethylpropanesulfonic acid or its copolymers, polydimethyldiallylammonium chlorides or their copolymers, polyamidines or their copolymers, polyimidazolines, dicyanamide type condensates, epichlorohydrin/dimethylamine condensates, Hofmann decomposed products of polyacrylamides, and water-soluble polyesters (Plascoat Z-221, Z-446, Z-561, Z-450, Z-565, Z-850, Z-3308, RZ-105, RZ-570, Z-730 and RZ-142 (all of these names are trade names), manufactured by Goo Chemical Co., Ltd.).

In addition, highly-water-absorptive polymers, namely, homopolymers of vinyl monomers having —COOM or —$SO_3M$ (M represents a hydrogen atom or an alkali metal atom) or copolymers of these vinyl monomers among them or with other vinyl monomers (for example, sodium methacrylate, ammonium methacrylate, Sumikagel L-SH (trade name) manufactured by Sumitomo Chemical Co., Ltd.) as described in, for example, U.S. Pat. No. 4,960,681 and JP-A-62-245260, may also be used.

Among the water-soluble synthetic polymers that can be used in the present invention, polyvinyl alcohols are preferable. The polyvinyl alcohols are explained in detail below.

Examples of completely saponificated polyvinyl alcohol include PVA-105 [polyvinyl alcohol (PVA) content: 94.0 mass % or more; degree of saponification: 98.5±0.5 mol %; content of sodium acetate: 1.5 mass % or less; volatile constituent: 5.0 mass % or less; viscosity (4 mass %; 20° C.): 5.6±0.4 CPS]; PVA-110 [PVA content: 94.0 mass %; degree of saponification: 98.5±0.5 mol %; content of sodium acetate: 1.5 mass %; volatile constituent: 5.0 mass %; viscosity (4 mass %; 20° C.): 11.0±0.8 CPS]; PVA-117 [PVA content: 94.0 mass %; degree of saponification: 98.5±0.5 mol %; content of sodium acetate: 1.0 mass %; volatile constituent: 5.0 mass %; viscosity (4 mass %; 20° C.): 28.0±3.0 CPS]; PVA-117H [PVA content: 93.5 mass %; degree of saponification: 99.6±0.3 mol %; content of sodium acetate: 1.85 mass %; volatile constituent: 5.0 mass %; viscosity (4 mass %; 20° C.): 29.0±3.0 CPS]; PVA-120 [PVA content: 94.0 mass %; degree of saponification: 98.5±0.5 mol %; content of sodium acetate: 1.0 mass %; volatile constituent: 5.0 mass %; viscosity (4 mass %; 20° C.): 39.5±4.5 CPS]; PVA-124 [PVA content: 94.0 mass %; degree of saponification: 98.5±0.5 mol %; content of sodium acetate: 1.0 mass %; volatile constituent: 5.0 mass %; viscosity (4 mass %; 20° C.): 60.0±6.0 CPS]; PVA-124H [PVA content: 93.5 mass %; degree of saponification: 99.6±0.3 mol %; content of sodium acetate: 1.85 mass %; volatile constituent: 5.0 mass %; viscosity (4 mass %; 20° C.): 61.0±6.0 CPS]; PVA-CS [PVA content: 94.0 mass %; degree of saponification: 97.5±0.5 mol %; content of sodium acetate: 1.0 mass %; volatile constituent: 5.0 mass %; viscosity (4 mass %; 20° C.): 27.5±3.0 CPS]; PVA-CST [PVA content: 94.0 mass %; degree of saponification: 96.0±0.5 mol %; content of sodium acetate: 1.0 mass %; volatile constituent: 5.0 mass %; viscosity (4 mass %; 20° C.): 27.0±3.0 CPS]; and PVA-HC [PVA content: 90.0 mass %; degree of saponification: 99.85 mol % or more; content of sodium acetate: 2.5 mass %; volatile constituent: 8.5 mass %; viscosity (4 mass %; 20° C.): 25.0±3.5 CPS] (all trade names, manufactured by Kuraray Co., Ltd.), and the like.

Examples of partially saponificated polyvinyl alcohol include PVA-203 [PVA content: 94.0 mass %; degree of saponification: 88.0±1.5 mol %; content of sodium acetate: 1.0 mass %; volatile constituent: 5.0 mass %; viscosity (4 mass %; 20° C.): 3.4±0.2 CPS]; PVA-204 [PVA content: 94.0 mass %; degree of saponification: 88.0±1.5 mol %; content of sodium acetate: 1.0 mass %; volatile constituent: 5.0 mass %; viscosity (4 mass %; 20° C.): 3.9±0.3 CPS]; PVA-205 [PVA content: 94.0 mass %; degree of saponification: 88.0±1.5 mol %; content of sodium acetate: 1.0 mass %; volatile constituent: 5.0 mass %; viscosity (4 mass %; 20° C.): 5.0±0.4 CPS]; PVA-210 [PVA content: 94.0 mass %; degree of saponification: 88.0±1.0 mol %; content of sodium acetate: 1.0 mass %; volatile constituent: 5.0 mass %; viscosity (4 mass %; 20° C.): 9.0±1.0 CPS]; PVA-217 [PVA content: 94.0 mass %; degree of saponification: 88.0±1.0 mol %; content of sodium acetate: 1.0 mass %; volatile constituent: 5.0 mass %; viscosity (4 mass %; 20° C.): 22.5±2.0 CPS]; PVA-220 [PVA content: 94.0 mass %; degree of saponification: 88.0±1.0 mol %; content of sodium acetate: 1.0 mass %; volatile constituent: 5.0 mass %; viscosity (4 mass %; 20° C.): 30.0±3.0 CPS]; PVA-224 [PVA content: 94.0 mass %; degree of saponification: 88.0±1.5 mol %; content of sodium acetate: 1.0 mass %; volatile constituent: 5.0 mass %; viscosity (4 mass %; 20° C.): 44.0±4.0 CPS]; PVA-228 [PVA content: 94.0 mass %; degree of saponification: 88.0±1.5 mol %; content of sodium acetate: 1.0 mass %; volatile constituent: 5.0 mass %; viscosity (4 mass %; 20° C.): 65.0±5.0 CPS]; PVA-235 [PVA content: 94.0 mass %; degree of saponification: 88.0±1.5 mol %; content of sodium acetate: 1.0 mass %; volatile constituent: 5.0 mass %; viscosity (4 mass %; 20° C.): 95.0±15.0 CPS]; PVA-217EE [PVA content: 94.0 mass %; degree of saponification: 88.0±1.0 mol %; content of sodium acetate: 1.0 mass %; volatile constituent: 5.0 mass %; viscosity (4 mass %; 20° C.): 23.0±3.0 CPS]; PVA-217E [PVA content: 94.0 mass %; degree of saponification: 88.0±1.0 mol %; content of sodium acetate: 1.0 mass %; volatile constituent: 5.0 mass %; viscosity (4 mass %; 20° C.): 23.0±3.0 CPS]; PVA-220E [PVA content: 94.0 mass %; degree of saponification: 88.0±1.0 mol %; content of sodium acetate: 1.0 mass %; volatile constituent: 5.0 mass %; viscosity (4 mass %; 20° C.): 31.0±4.0 CPS]; PVA-224E [PVA content: 94.0 mass %; degree of saponification: 88.0±1.0 mol %; content of sodium acetate: 1.0 mass %; volatile constituent: 5.0 mass %; viscosity (4 mass %; 20° C.): 45.0±5.0 CPS]; PVA-403 [PVA content: 94.0 mass %; degree of saponification: 80.0±1.5 mol %; content of sodium acetate: 1.0 mass %; volatile constituent: 5.0 mass %; viscosity (4 mass %; 20° C.): 3.1±0.3 CPS]; PVA-405 [PVA content: 94.0 mass %; degree of saponification: 81.5±1.5 mol %; content of sodium acetate: 1.0 mass %; volatile constituent: 5.0 mass %; viscosity (4 mass %; 20° C.): 4.8±0.4 CPS]; PVA-420 [PVA content: 94.0 mass %; degree of saponification: 79.5±1.5 mol %; content of sodium acetate: 1.0 mass %; volatile constituent: 5.0 mass %]; PVA-613 [PVA content: 94.0 mass %; degree of saponification: 93.5±1.0 mol %; content of sodium acetate: 1.0 mass %; volatile constituent: 5.0 mass %; viscosity (4 mass %; 20° C.): 16.5±2.0 CPS]; L-8 [PVA content: 96.0 mass %; degree of saponification: 71.0±1.5 mol %; content of sodium acetate: 1.0 mass % (ash); volatile constituent: 3.0 mass %; viscosity (4 mass %; 20° C.): 5.4±0.4 CPS] (all trade names, manufactured by Kuraray Co., Ltd.), and the like.

The above values were measured in the manner described in JIS K-6726-1977.

With respect to modified polyvinyl alcohols, those described in Koichi Nagano, et al., "Poval", Kobunshi Kankokai, Inc. are useful. The modified polyvinyl alcohols include polyvinyl alcohols modified by cations, anions, —SH compounds, alkylthio compounds, or silanols.

Examples of such modified polyvinyl alcohols (modified PVA) include C polymers such as C-118, C-318, C-318-2A, and C-506 (all being trade names of Kuraray Co., Ltd.); HL polymers such as HL-12E and HL-1203 (all being trade names of Kuraray Co., Ltd.); HM polymers such as HM-03 and HM-N-03 (all being trade names of Kuraray Co., Ltd.); K polymers such as KL-118, KL-318, KL-506, KM-118T, and KM-618 (all being trade names of Kuraray Co., Ltd.); M polymers such as M-115 (a trade name of Kuraray co., Ltd.); MP polymers such as MP-102, MP-202, and MP-203 (all being trade names of Kuraray Co., Ltd.); MPK polymers such as MPK-1, MPK-2, MPK-3, MPK-4, MPK-5, and MPK-6 (all being trade names of Kuraray Co., Ltd.); R polymers such as R-1130, R-2105, and R-2130 (all being trade names of Kuraray Co., Ltd.); and V polymers such as V-2250 (a trade name of Kuraray Co., Ltd.).

The viscosity of polyvinyl alcohol can be adjusted or stabilized by adding a trace amount of a solvent or an inorganic salt to an aqueous solution of polyvinyl alcohol, and there can be employed compounds described in the aforementioned reference "Poval", Koichi Nagano et al., published by Kobunshi Kankokai, pp. 144-154. For example, a coated-surface quality can be improved by an addition of boric acid, and the addition of boric acid is preferable. The amount of boric acid added is preferably 0.01 to 40 mass % with respect to polyvinyl alcohol.

Preferred binders (water-soluble polymers) are transparent or semitransparent, and generally colorless. Examples include natural resins, polymers and copolymers; synthetic resins, polymers, and copolymers; and other media that form films: for example, rubbers, polyvinyl alcohols, hydroxyethyl celluloses, cellulose acetates, cellulose acetate butylates, polyvinylpyrrolidones, starches, polyacrylic acids, polymethyl methacrylates, polyvinyl chlorides, polymethacrylic acids, styrene/maleic acid anhydride copolymers, styrene/acrylonitrile copolymers, styrene/butadiene copolymers, polyvinylacetals (e.g., polyvinylformals and polyvinylbutyrals), polyesters, polyurethanes, phenoxy resins, polyvinylidene chlorides, polyepoxides, polycarbonates, polyvinyl acetates, polyolefins, cellulose esters, and polyamides. These media are water-soluble.

In the present invention, preferred water-soluble polymers are polyvinyl alcohols and gelatin, with gelatin being most preferred.

The amount of the water-soluble polymer contained in the receptor layer is preferably from 1 to 25% by mass, more preferably from 1 to 10% by mass based on the entire mass of the receptor layer.

<Hardener>

As a crosslinking agent (compound capable of crosslinking a water-soluble polymer), a hardener (hardening agent) may be contained in coating layers (e.g., the receptor layer, the heat insulation layer, the undercoat layer) of the image-receiving sheet.

The receptor layer preferably contains a crosslinking agent.

A part or all of the above-mentioned water-soluble polymer contained in the receptor layer has been preferably crosslinked with the crosslinking agent.

Preferable examples of the hardener that can be used in the present invention include H-1, 4, 6, 8, and 14 in JP-A-1-214845 in page 17; compounds (H-1 to H-54) represented by one of the formulae (VII) to (XII) in U.S. Pat. No. 4,618,573, columns 13 to 23; compounds (H-1 to H-76) represented by the formula (6) in JP-A-2-214852, page 8, the lower right (particularly, H-14); and compounds described in claim 1 in U.S. Pat. No. 3,325,287. Examples of the hardening agent include hardening agents described, for example, in U.S. Pat. No. 4,678,739, column 41, U.S. Pat. No. 4,791,042, JP-A-59-116655, JP-A-62-245261, JP-A-61-18942, and JP-A-4-218044. More specifically, an aldehyde-series hardening agent (formaldehyde, etc.), an aziridine-series hardening agent, an epoxy-series hardening agent, a vinyl sulfone-series hardening agent (N,N'-ethylene-bis(vinylsulfonylacetamido) ethane, etc.), an N-methylol-series hardening agent (dimethylol urea, etc.), a boric acid, a metaboric acid, or a polymer hardening agent (compounds described, for example, in JP-A-62-234157), can be mentioned.

Preferable examples of the hardener include a vinylsulfone-series hardener and chlorotriazines.

More preferable hardeners in the present invention are compounds represented by the following Formula (B) or (C).

$$(CH_2{=}CH{-}SO_2)_n\text{-}L \qquad \text{Formula (B)}$$

$$(X{-}CH_2{-}CH_2{-}SO_2)_n\text{-}L \qquad \text{Formula (C)}$$

In formulae (B) and (C), X represents a halogen atom, L represents an organic linking group having n-valency. When the compound represented by formula (B) or (C) is a low-molecular compound, n denotes an integer from 1 to 4. When the compound represented by formula (B) or (C) is a high-molecular (polymer) compound, L represents an organic linking group containing a polymer chain and n denotes an integer ranging from 10 to 1,000.

In the Formulae (B) and (C), X is preferably a chlorine atom or a bromine atom, and further preferably a bromine atom. n is an integer from 1 to 4, preferably an integer from 2 to 4, more preferably 2 or 3 and most preferably 2.

L represents an organic linking group having n-valency, and preferably an aliphatic hydrocarbon group, an aromatic hydrocarbon group or a heterocyclic group, provided that these groups may be combined through an ether bond, ester bond, amide bond, sulfonamide bond, urea bond, urethane bond or the like. Also, each of these groups may be further substituted. Examples of the substituent include a halogen atom, alkyl group, aryl group, heterocyclic group, hydroxyl group, alkoxy group, aryloxy group, alkylthio group, arylthio group, acyloxy group, alkoxycarbonyl group, carbamoyloxy group, acyl group, acyloxy group, acylamino group, sulfonamide group, carbamoyl group, sulfamoyl group, sulfonyl group, phosphoryl group, carboxyl group and sulfo group. Among these groups, a halogen atom, alkyl group, hydroxy group, alkoxy group, aryloxy group and acyloxy group are preferable.

Specific examples of the vinylsulfone-series hardener include, though not limited to, the following compounds (VS-1) to (VS-27).

(VS-1)

$CH_2{=}CH{-}SO_2{-}CH_2{-}SO_2{-}CH{=}CH_2$ (VS-2)

$CH_2{=}CH{-}SO_2{-}CH_2CH_2{-}SO_2{-}CH{=}CH_2$ (VS-3)

$CH_2{=}CH{-}SO_2{-}CH_2CH_2CH_2{-}SO_2{-}CH{=}CH_2$ (VS-4)

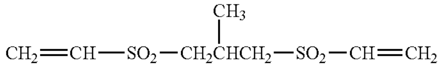

(VS-5)

$CH_2{=}CH{-}SO_2{-}CH_2OCH_2{-}SO_2{-}CH{=}CH_2$ (VS-6)

$CH_2{=}CH{-}SO_2{-}CH_2CH_2OCH_2CH_2{-}SO_2{-}CH{=}CH_2$ (VS-7)

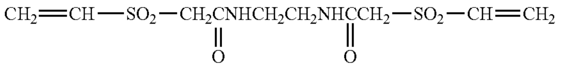

(VS-8)

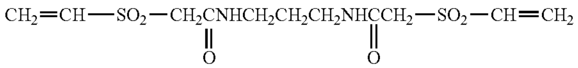

(VS-9)

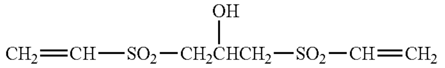

(VS-10)

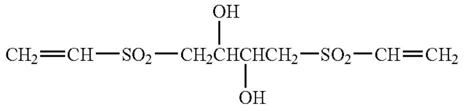

(VS-11)

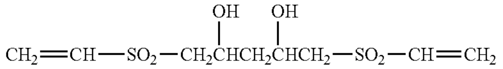

(VS-12)

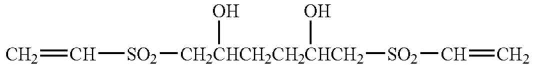

(VS-13)

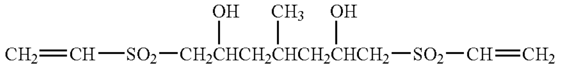

(VS-14)

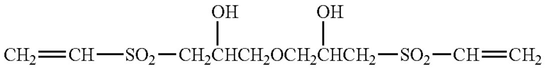

(VS-15)

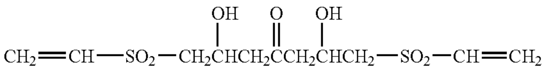

(VS-16)

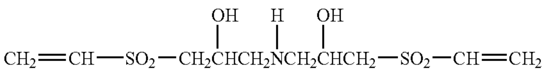

(VS-17)

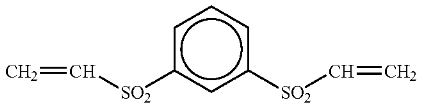

-continued (VS-18)

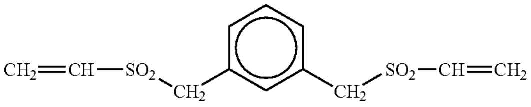

(VS-19)

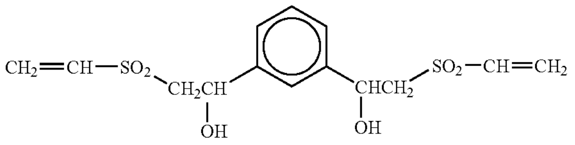

(VS-20)

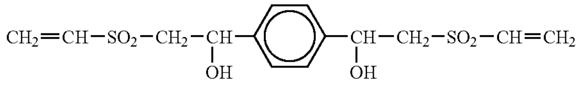

(VS-21)

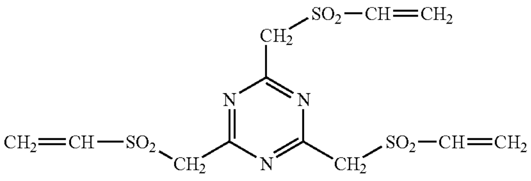

(VS-22)

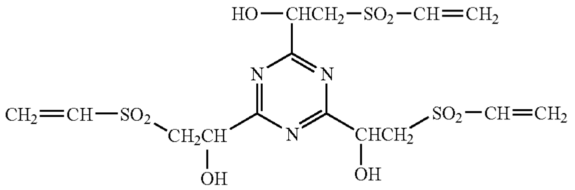

(VS-23)

$Cl{-}CH_2{-}CH_2{-}SO_2{-}CH_2{-}SO_2{-}CH_2{-}CH_2{-}Cl$ (VS-24)

$Br{-}CH_2{-}CH_2{-}SO_2{-}CH_2{-}SO_2{-}CH_2{-}CH_2{-}Br$ (VS-25)

$Br{-}CH_2{-}CH_2{-}SO_2{-}CH_2OCH_2{-}SO_2{-}CH_2{-}CH_2{-}Br$ (VS-26)

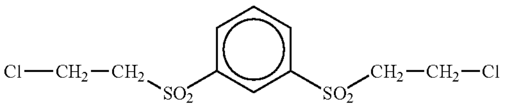

(VS-27)

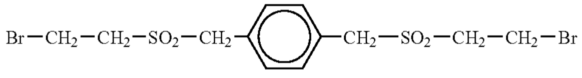

These hardeners may be obtained with reference to the method described in, for example, the specification of U.S. Pat. No. 4,173,481.

Furthermore, as the chlorotriazine-series hardener, a 1,3,5-triazine compound in which at least one of the 2-position, 4-position and 6-position of the triazine ring in the compound is substituted with a chlorine atom, is preferable. A 1,3,5-triazine compound in which two or three of the 2-position, 4-position and 6-position of the triazine ring each are substituted with a chlorine atom, is more preferable. Alternatively, use may be made of a 1,3,5-triazine compound in which at least one of the 2-position, 4-position and 6-position of the triazine ring is substituted with a chlorine atom, and the remainder position(s) is/are substituted with a group(s) or atom(s) other than a chlorine atom. Examples of these other groups include a hydrogen atom, bromine atom, fluorine atom, iodine atom, alkyl group, alkenyl group, alkynyl group, cycloalkyl group, cycloalkenyl group, aryl group, heterocyclic group, hydroxy group, nitro group, cyano group, amino group, hydroxylamino group, alkylamino group, arylamino group, heterocyclic amino group, acylamino group, sulfonamide group, carbamoyl group, sulfamoyl group, sulfo group, carboxyl group, alkoxy group, alkenoxy group, aryloxy group, heterocyclic oxy group, acyl group, acyloxy group, alkyl- or aryl-sulfonyl group, alkyl- or aryl-sulfinyl group, alkyl- or aryl-sulfonyloxy group, mercapto group, alkylthio group, alkenylthio group, arylthio group, heterocyclic thio group and alkyloxy- or aryloxy-carbonyl group.

Specific examples of the chlorotriazine-series hardener include, though not limited to, 4,6-dichloro-2-hydroxy-1,3,5-triazine or its Na salt, 2-chloro-4,6-diphenoxytriazine, 2-chloro-4,6-bis[2,4,6-trimethylphenoxy]triazine, 2-chloro-4,6-diglycidoxy-1,3,5-triazine, 2-chloro-4-(n-butoxy)-6-glycidoxy-1,3,5-triazine, 2-chloro-4-(2,4,6-trimethylphenoxy)-6-glycidoxy-1,3,5-triazine, 2-chloro-4-(2-chloroethoxy)-6-(2,4,6-trimethylphenoxy)-1,3,5-triazine, 2-chloro-4-(2-bromoethoxy)-6-(2,4,6-trimethylphenoxy)-1,3,5-triazine, 2-chloro-4-(2-di-n-butylphosphateethoxy)-6-(2,4,6-trimethylphenoxy)-1,3,5-triazine and 2-chloro-4-(2-di-n-butylphosphateethoxy)-6-(2,6-xylenoxy)-1,3,5-triazine.

Such a compound is easily produced by reacting cyanur chloride (namely, 2,4,6-trichlorotriazine) with, for example, a hydroxy compound, thio compound or amino compound corresponding to the substituent on the heterocycle.

These hardeners are preferably used in an amount of 0.001 to 1 g, and further preferably 0.005 to 0.5 g, per 1 g of the water-soluble polymer.

<Emulsion>

An emulsion is preferably incorporated in the receptor layer of the heat-sensitive transfer image-receiving sheet of the present invention. The following is a detailed explanation of the emulsion that is preferably used in the present invention.

Hydrophobic additives, such as a lubricant, an antioxidant, and the like, can be introduced into a layer of the image-receiving sheet (e.g. the receptor layer, the heat insulation layer, the undercoat layer), by using a known method described in U.S. Pat. No. 2,322,027, or the like. In this case, a high-boiling organic solvent, as described in U.S. Pat. Nos. 4,555,470, 4,536,466, 4,536,467, 4,587,206, 4,555,476 and 4,599,296, JP-B-3-62256, and the like, may be used singly or in combination with a low-boiling organic solvent having a boiling point of 50 to 160° C., according to the need. Also, these lubricants, antioxidants, and high-boiling organic solvents may be respectively used in combination of two or more.

As the antioxidant (hereinafter, also referred to as a radical trapper in this specification), a compound represented by any one of the following formulae (E-1) to (E-3) is preferably used.

Formula (E-1)

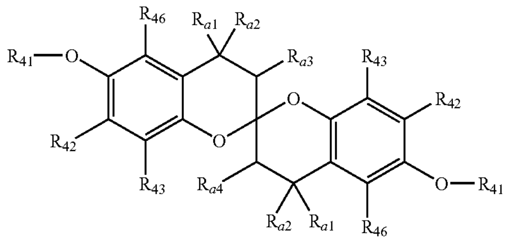

Formula (E-2)

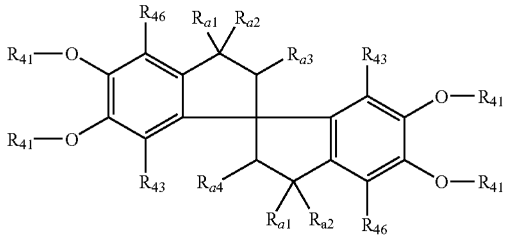

Formula (E-3)

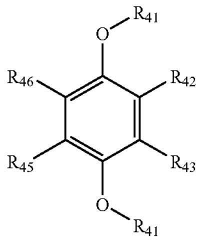

$R_{41}$ represents an aliphatic group, an aryl group, a heterocyclic group, an acyl group, an aliphatic oxycarbonyl group, an aryloxycarbonyl group, an aliphatic sulfonyl group, an arylsulfonyl group, a phosphoryl group, or a group —Si($R_{47}$)($R_{48}$)($R_{49}$) in which $R_{47}$, $R_{48}$ and $R_{49}$ each independently represent an aliphatic group, an aryl group, an aliphatic oxy group, or an aryloxy group. $R_{42}$ to $R_{46}$ each independently represent a hydrogen atom, or a substituent. Examples of the substituent include a halogen atom, aliphatic group (including an alkyl group, alkenyl group, alkynyl group, cycloalkyl group, and cycloalkenyl group), aryl group, heterocyclic group, hydroxy group, mercapto group, aliphaticoxy group, aryloxy group, heterocyclic oxy group, aliphaticthio group, arylthio group, heterocyclic thio group, amino group, aliphaticamino group, arylamino group, heterocyclic amino group, acylamino group, sulfonamide group, cyano group, nitro group, carbamoyl group, sulfamoyl group, acyl group, aliphatic oxycarbonyl group, and aryloxycarbonyl group. $R_{a1}$, $R_{a2}$, $R_{a3}$, and $R_{a4}$ each independently represent a hydrogen atom, or an aliphatic group (for example, methyl, ethyl).

With respect to the compounds represented by any one of the Formulae (E-1) to (E-3), the groups that are preferred from the viewpoint of the effect to be obtained by the present invention, are explained below.

In the Formulae (E-1) to (E-3), it is preferred that $R_4$ represents an aliphatic group, an acyl group, an aliphatic oxycarbonyl group, an aryloxycarbonyl group, or a phosphoryl group, and $R_{42}$, $R_{43}$, $R_{45}$, and $R_{46}$ each independently represent a hydrogen atom, an aliphatic group, an aliphatic oxy group, or an acylamino group. It is more preferred that $R_4$ represents an aliphatic group, and $R_{42}$, $R_{43}$, $R_{45}$ and $R_{46}$ each independently represent a hydrogen atom or an aliphatic group.

Preferable specific examples of the compounds represented by any one of the Formulae (E-1) to (E-3) are shown below, but the present invention is not limited to these compounds.

EB-1

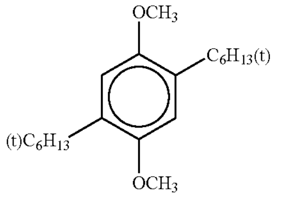

EB-2

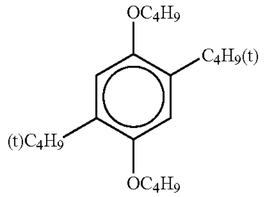

EB-3

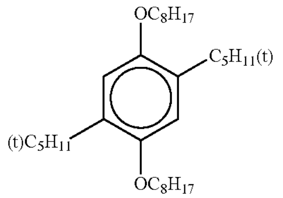

EB-4

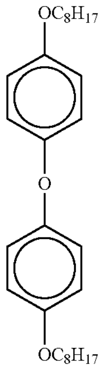

EB-5

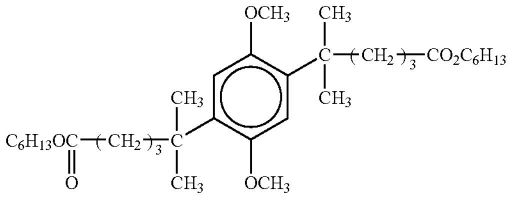

EB-6

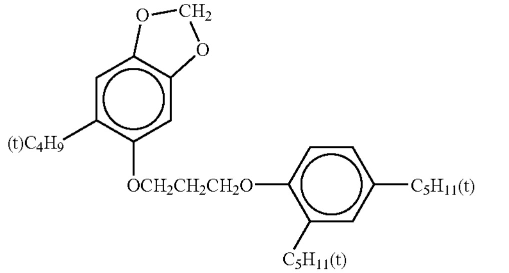

-continued

EB-7

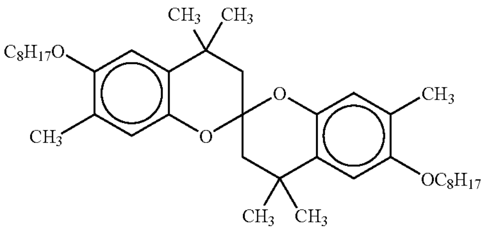

EB-8

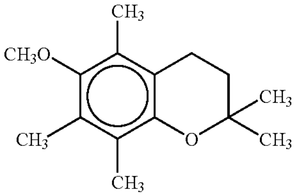

EB-9

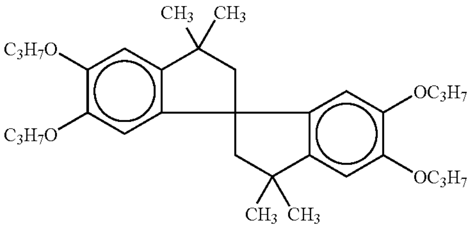

EB-10

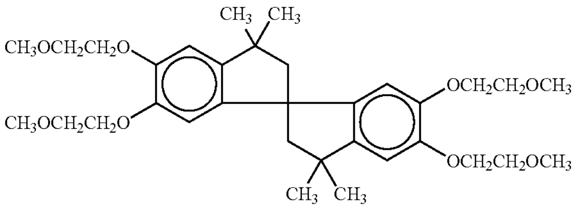

EB-11

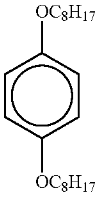

A content of the antioxidizing agent is preferably from 1.0 to 7.0 mass %, more preferably from 2.5 to 5.0 mass %, based on a solid content in the latex polymer. As the lubricant, solid waxes such as polyethylene wax, amide wax and Teflon (registered trademark) powder; silicone oil, phosphate-series compounds, fluorine-based surfactants, silicone-based surfactants and others including releasing agents known in the technical fields concerned may be used. Fluorine-series compounds typified by fluorine-based surfactants, silicone-based surfactants and silicone-series compounds such as silicone oil and/or its hardened products are preferably used. A content of the lubricant is preferably from 1.0 to 10.0 mass %, more preferably from 1.5 to 2.5 mass %, based on a solid content in the latex polymer.

As the silicone oil as the lubricant, straight silicone oil and modified silicone oil or their hardened products may be used.

Examples of the straight silicone oil include dimethylsilicone oil, methylphenylsilicone oil and methyl hydrogen silicone oil. Examples of the dimethylsilicone oil include KF96-10, KF96-100, KF96-1000, KF96H-10000, KF96H-12500 and KF96H-100000 (all of these names are trade names, manufactured by Shin-Etsu Chemical Co., Ltd.). Examples of the methylphenylsilicone oil include KF50-100, KF54 and KF56 (all of these names are trade names, manufactured by Shin-Etsu Chemical Co., Ltd.).

The modified silicone oil may be classified into reactive silicone oils and non-reactive silicone oils. Examples of the reactive silicone oils include amino-modified, epoxy-modified, carboxyl-modified, hydroxy-modified, methacryl-modified, mercapto-modified, phenol-modified or one-terminal reactive/hetero-functional group-modified silicone oils. Examples of the amino-modified silicone oil include KF-393, KF-857, KF-858, X-22-3680, X-22-3801C, KF-8010, X-22-161A and KF-8012 (all of these names are trade names, manufactured by Shin-Etsu Chemical Co., Ltd.). Examples of the epoxy-modified silicone oil include KF-100T, KF-11, KF-60-164, KF-103, X-22-343 and X-22-3000T (all of these names are trade names, manufactured by Shin-Etsu Chemical Co., Ltd.). Examples of the carboxyl-modified silicone oil include X-22-162C (trade name, manufactured by Shin-Etsu Chemical Co., Ltd.). Examples of the hydroxy-modified silicone oil include X-22-160AS, KF-6001, KF-6002, KF-6003, X-22-170DX, X-22-176DX, X-22-176D and X-22-176DF (all of these names are trade names, manufactured by Shin-Etsu Chemical Co., Ltd.). Examples of the methacryl-modified silicone oil include X-22-164A, X-22-164C, X-24-8201, X-22-174D and X-22-2426 (all of these names are trade names, manufactured by Shin-Etsu Chemical Co., Ltd.).

Reactive silicone oils may be hardened upon use, and may be classified into a reaction-curable type, photocurable type, catalyst-curable type, and the like. Among these types, silicone oil that is the reaction-curable type is particularly preferable. As the reaction-curable type silicone oil, products obtained by reacting an amino-modified silicone oil with an epoxy-modified silicone oil and then by curing are preferable. Also, examples of the catalyst-curable type or photocurable type silicone oil include KS-705F-PS, KS-705F-PS-1 and KS-770-PL-3 (all of these names are trade names, catalyst-curable silicone oils, manufactured by Shin-Etsu Chemical Co., Ltd.) and KS-720 and KS-774-PL-3 (all of these names are trade names, photocurable silicone oils, manufactured by Shin-Etsu Chemical Co., Ltd.). The addition amount of the curable type silicone oil is preferably 0.5 to 30% by mass based on the resin constituting the receptor layer. The releasing agent is used preferably in an amount of 2 to 4% by mass and further preferably 2 to 3% by mass based on 100 parts by mass of the polyester resin. If the amount is too small, the releasability cannot be secured without fail, whereas if the amount is excessive, a protective layer is not transferred to the image-receiving sheet resultantly.

Examples of the non-reactive silicone oil include polyether-modified, methylstyryl-modified, alkyl-modified, higher fatty acid ester-modified, hydrophilic special-modified, higher alkoxy-modified or fluorine-modified silicone oils. Examples of the polyether-modified silicone oil include KF-6012 (trade name, manufactured by Shin-Etsu Chemical Co., Ltd.) and examples of the methylstyryl-modified silicone oil include 24-510 and KF41-410 (all of these names are trade names, manufactured by Shin-Etsu Chemical Co., Ltd.). Modified silicones represented by any one of the following Formulae 1 to 3 may also be used.

Formula 1

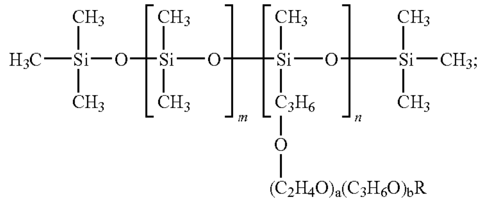

In the Formula 1, R represents a hydrogen atom or a straight-chain or branched alkyl group which may be substituted with an aryl or cycloalkyl group. m and n respectively denote an integer of 2,000 or less, and a and b respectively denote an integer of 30 or less.

Formula 2

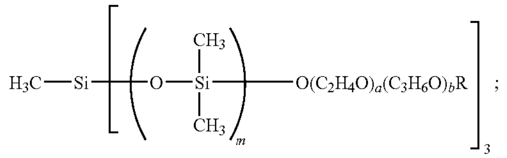

In the Formula 2, R represents a hydrogen atom or a straight-chain or branched alkyl group which may be substituted with an aryl or cycloalkyl group. m denotes an integer of 2,000 or less, and a and b respectively denote an integer of 30 or less.

Formula 3

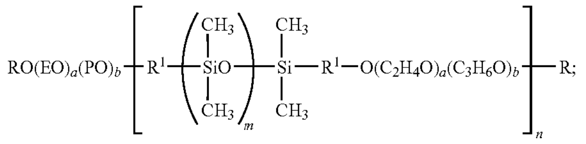

In the Formula 3, R represents a hydrogen atom or a straight-chain or branched alkyl group which may be substituted with an aryl or cycloalkyl group. m and n respectively denote an integer of 2,000 or less, and a and b respectively denote an integer of 30 or less. $R^1$ represents a single bond or a divalent linking group, E represents an ethylene group which may be further substituted, and P represents a propylene group which may be further substituted.

Silicone oils such as those mentioned above are described in "SILICONE HANDBOOK" (The Nikkan Kogyo Shimbun, Ltd.) and the technologies described in each publication of JP-A-8-108636 and JP-A-2002-264543 may be preferably used as the technologies to cure the curable type silicone oils.

Examples of the high-boiling organic solvent include phthalates (e.g., dibutyl phthalate, dioctyl phthalate, di-2-ethylhexyl phthalate), phosphates or phosphonates (e.g., triphenyl phosphate, tricresyl phosphate, tri-2-ethylhexyl phosphate), fatty acid esters (e.g., di-2-ethylhexyl succinate, tributyl citrate), benzoates (e.g., 2-ethylhexyl benzoate, dodecyl benzoate), amides (e.g., N,N-diethyldodecane amide, N,N-dimethylolein amide), alcohols or phenols (e.g., isostearyl alcohol, 2,4-di-tert-amyl phenol), anilines (e.g., N,N-dibutyl-2-butoxy-5-tert-octylaniline), chlorinated paraffins, hydrocarbons (e.g., dodecyl benzene, diisopropyl naphthalene), and carboxylic acids (e.g., 2-(2,4-di-tert-amyl phenoxy)butyrate).

Preferably the compounds shown below are used.

(Solv-1)

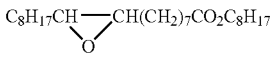

(Solv-2)

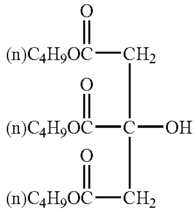

(Solv-3)

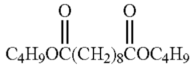

(Solv-4)

$O{=}P(OC_6H_{13}(n))_3$ (Solv-5)

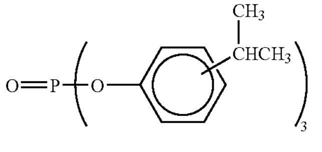

(Solv-6)

$C_8H_{17}CH{=}CHC_8H_{16}OH$ (Solv-7)

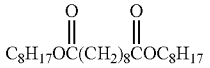

(Solv-8)

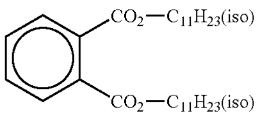

(Solv-9)

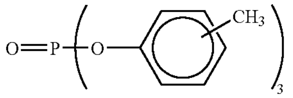

Further, the high-boiling organic solvent may be used in combination with, as an auxiliary solvent, an organic solvent having a boiling point of 30° C. or more and 160° C. or less, such as ethyl acetate, butyl acetate, methyl ethyl ketone, cyclohexanone, methylcellosolve acetate, or the like. The high-boiling organic solvent is used in an amount of generally 1 to 10 g, preferably 5 g or less, and more preferably 1 to 0.1 g, per 1 g of the hydrophobic additives to be used. The amount is also preferably 1 ml or less, more preferably 0.5 ml or less, and particularly preferably 0.3 ml or less, per 1 g of the binder.

A dispersion method that uses a polymer, as described in JP-B-51-39853 and JP-A-51-59943, and a method wherein the addition is made with them in the form of a dispersion of fine particles, as described in, for example, JP-A-62-30242, can also be used. In the case of a compound that is substantially insoluble in water, other than the above methods, a method can be used wherein the compound is dispersed and contained in the form of fine particles in a binder.

When the hydrophobic compound is dispersed in a hydrophilic colloid, various surfactants may be used. For example, those listed as examples of the surfactant in JP-A-59-157636, page (37) to page (38) may be used. It is also possible to use phosphates-based surfactants described in JP-A-7-56267, JP-A-7-228589, and West German Patent Application Laid-Open (OLS) No. 1,932,299A.

<Ultraviolet Absorber>

Also, in the present invention, in order to improve light resistance, an ultraviolet absorber may be contained in the receptor layer. In this case, when this ultraviolet absorber is made to have a higher molecular weight, it can be secured to the receptor layer so that it can be prevented, for instance, from being diffused into the ink sheet and from being sublimated and vaporized by heating.

As the ultraviolet absorber, compounds having various ultraviolet absorber skeletons, which are widely used in the field of information recording, may be used. Specific examples of the ultraviolet absorber may include compounds having a 2-hydroxybenzotriazole type ultraviolet absorber skeleton, 2-hydroxybenzotriazine type ultraviolet absorber skeleton, or 2-hydroxybenzophenon type ultraviolet absorber skeleton. Compounds having a benzotriazole-type or triazine-type skeleton are preferable from the viewpoint of ultraviolet absorbing ability (absorption coefficient) and stability, and compounds having a benzotriazole-type or benzophenone-type skeleton are preferable from the viewpoint of obtaining a higher-molecular weight and using in a form of a latex. Specifically, ultraviolet absorbers described in, for example, JP-A-2004-361936 may be used.

The ultraviolet absorber preferably absorbs light at wavelengths in the ultraviolet region, and the absorption edge of the absorption of the ultraviolet absorber is preferably out of the visible region. Specifically, when it is added to the receptor layer to form a heat-sensitive transfer image-receiving sheet, the heat-sensitive transfer image-receiving sheet has a reflection density of, preferably, Abs 0.5 or more at 370 nm, and more preferably Abs 0.5 or more at 380 nm. Also, the heat-sensitive transfer image-receiving sheet has a reflection density of, preferably, Abs 0.1 or less at 400 nm. If the reflection density at a wavelength range exceeding 400 nm is high, it is not preferable because an image is made yellowish.

In the present invention, the ultraviolet absorber is preferably made to have a higher molecular weight. The ultraviolet absorber has a mass average molecular weight of preferably 10,000 or more, and more preferably 100,000 or more. As a means of obtaining a higher-molecular weight ultraviolet absorber, it is preferable to graft an ultraviolet absorber on a polymer. The polymer as the principal chain preferably has a polymer skeleton less capable of being dyed than the receptor polymer to be used together. Also, when the polymer is used to form a film, the film preferably has sufficient film strength. The graft ratio of the ultraviolet absorber to the polymer principal chain is preferably 5 to 20% by mass and more preferably 8 to 15% by mass.

Also, it is more preferable that the ultraviolet-absorber-grafted polymer is made to be used in a form of a latex. When the polymer is made to be used in a form of a latex, an aqueous dispersion-system coating solution may be used in application and coating to form the receptor layer, and this enables reduction of production cost. As a method of making the latex polymer (or making the polymer latex-wise), a method described in, for example, Japanese Patent No. 3450339 may be used. As the ultraviolet absorber to be used in a form of a latex, the following commercially available ultraviolet absorbers may be used which include ULS-700, ULS-1700, ULS-1383MA, ULS-1635 MH, XL-7016, ULS-933LP, and ULS-935LH, manufactured by Ipposha Oil Industries Co., Ltd.; and New Coat UVA-1025W, New Coat UVA-204W, and New Coat UVA-4512M, manufactured by Shin-Nakamura Chemical Co., Ltd. (all of these names are trade names).

In the case of using an ultraviolet-absorber-grafted polymer in a form of a latex, it may be mixed with a latex of the receptor polymer capable of being dyed, and the resulting mixture is coated. By doing so, a receptor layer, in which the ultraviolet absorber is homogeneously dispersed, can be formed.

The addition amount of the ultraviolet-absorber-grafted polymer or its latex is preferably 5 to 50 parts by mass, and more preferably 10 to 30 parts by mass, to 100 parts by mass of the receptor latex polymer capable of being dyed to be used to form the receptor layer.

<Releasing Agent>

Also, a releasing agent may be compounded in the receptor layer, in order to prevent thermal fusion with the heat-sensitive transfer sheet when an image is formed. As the releasing agent, a silicone oil, a phosphate-based plasticizer, a fluorine-series compound, or various wax dispersions may be used, and the silicone oil and the wax dispersions are particularly preferably used.

As the silicone oil, modified silicone oil, such as epoxy-modified, alkyl-modified, amino-modified, carboxyl-modified, alcohol-modified, fluorine-modified, alkyl aralkyl polyether-modified, epoxy/polyether-modified, or polyether-modified silicone oil, is preferably used. Among these, a reaction product between vinyl-modified silicone oil and hydrogen-modified silicone oil is preferable. The amount of the releasing agent is preferably 0.2 to 30 parts by mass, per 100 parts by mass of the receptor polymer.

As the wax dispersions, known dispersions may be used. In the present invention, “wax” means an organic compound having an alkyl chain which is in a solid or semisolid state at room temperature (according to the definition given in *Kaitei Wax no Seishitsu to Oyo* (Revised edition, Properties and Applications of Wax), Saiwai Shobo (1989)). Preferable examples of the organic compound include candelilla wax, carnauba wax, rice wax, haze wax, montan wax, ozokerite, paraffin wax, microcrystalline wax, petrolatum, Fischer-Tropsch wax, polyethylene wax, montan wax derivatives, paraffin wax derivatives, microcrystalline wax derivatives, hydrogenated ricinus, hydrogenated ricinus derivatives, 12-hydroxystearic acid, stearic acid amide, phthalic anhydride imide, chlorinated hydrocarbons, and other mixed waxes. Of these waxes, carnauba wax, montan wax and derivatives thereof, paraffin wax and derivatives thereof, microcrystalline wax and derivatives thereof, polyethylene wax and stearic acid amide are preferred; carnauba wax, montan wax and derivatives thereof, microcrystalline wax and stearic acid amide are more preferred; and montan wax, montan wax derivatives and microcrystalline wax are further preferred.

These waxes are selected from waxes having melting points of generally 25° C. to 120° C., preferably 40° C. to 100° C., more preferably 60° C. to 90° C.

The wax is preferably in a state of being dispersed in water, more preferably in the form of fine particles. Dispersing waxes in water and forming waxes into fine particles can be performed using the methods as described in “Kaitei Wax no Seishitsu to Oyo (Revised version, Properties and Applications of Wax)”, Saiwai Shobo (1989).

The addition amount of wax is preferably from 0.5 to 30% by mass, more preferably from 1 to 20% by mass, and further preferably from 1.5 to 15% by mass, of the amount of total solid content in the receptor layer.

The amount of the receptor layer to be applied is preferably 0.5 to 10 g/m$^2$ (solid basis, hereinafter, the amount to be applied in the present specification means a value on solid basis unless otherwise noted), more preferably 1 to 8 g/m$^2$, and further preferably 2 to 7 g/m$^2$. The film thickness of the receptor layer is preferably 1 to 20 μm.

(Heat Insulation Layer)

A heat insulation layer serves to protect the support from heat when a thermal head or the like is used to carry out a transfer operation under heating. Also, because the heat insulation layer has high cushion characteristics, a heat-sensitive transfer image-receiving sheet having high printing sensitivity can be obtained even in the case of using paper as a substrate (support). The heat insulation layer may be a single layer, or multi-layers. The heat insulation layer is generally arranged at a nearer location to the support than the receptor layer.

In the image-receiving sheet of the present invention, the heat insulation layer contains hollow polymer particles.

The hollow polymer particles of the present invention are polymer particles having independent pores inside of the particles. Examples of the hollow polymer particles include (1) non-foaming type hollow particles obtained in the following manner: a dispersion medium such as water is contained inside of a capsule wall formed of a polystyrene, acryl resin, or styrene/acryl resin and, after a coating solution is applied and dried, the dispersion medium in the particles is vaporized out of the particles, with the result that the inside of each particle forms a hollow; (2) foaming type microballoons obtained in the following manner: a low-boiling point liquid such as butane and pentane is encapsulated in a resin constituted of any one of polyvinylidene chloride, polyacrylonitrile, polyacrylic acid and polyacrylate, and their mixture or polymer, and after the resin coating material is applied, it is heated to expand the low-boiling point liquid inside of the particles whereby the inside of each particle is made to be hollow; and (3) microballoons obtained by foaming the above (2) under heating in advance, to make hollow polymer particles.

Among these, the (1) non-foaming type hollow particles are preferred. The (2) foaming type microballoons are required to foam microballoons by a process such as heating after forming a heat insulation layer by an applying process, so that it is difficult to form a smooth surface. Since the (3) microballoons obtained by foaming under heating in advance contain gas, it is difficult to prepare a homogeneous applying solution when particles are produced by an applying process, so that, likewise, it is difficult to form a smooth surface.

The method of producing the non-foaming type hollow particles of (1) is not particularly limited, and examples thereof include those described in JP-A-56-32513, JP-A-63-213509, JP-A-64-1704, JP-A-3-26724, JP-A-5-279409, JP-A-6-248012, and JP-A-10-182761 and the like.

The average diameter of the hollow polymer particles is preferably 0.1 to 20 μm, more preferably 0.1 to 2 μm, further preferably 0.1 to 1.5 μm, particularly preferably 0.3 to 1.5 μm, most preferably 0.45 to 1.5 μm. If the average diameter is too small, the resultant particles tend to have a smaller hollow ratio, which may cause it impossible to obtain a desired heat-insulation property; whereas, if the average diameter is too large, such hollow polymer particles having the particle size too large as compared with the film thickness of the heat insulation layer, may cause it difficult to provide a smooth surface and may tend to cause coating troubles due to the coarse particles.

In the present invention, the particle diameter of the hollow polymer particle is calculated after measurement of the circle-equivalent diameter of the periphery of particle under a transmission electron microscope. The average diameter is determined by measuring the circle-equivalent diameter of the periphery of at least 300 hollow polymer particles observed under a transmission electron microscope and obtaining the average thereof. Herein the term “circle-equivalent diameter” refers to the diameter of a circle having an area equivalent to the projected area of an individual particle.

The hollow polymer particle may not have a hollow structure unexpectedly depending on the preparative condition, but, in the present invention, the polymer not in the hollow structure is eliminated during measurement of the particle diameter. The particle not in the hollow structure, which does not have void therein, is lower in heat-insulating efficiency and often has a particle diameter smaller than that of the other particle in the hollow structure, rarely affecting the properties of the heat insulation layer.

Likewise, it also occurs that coarse particles are formed unintentionally and mixed in the hollow polymer particles. In the present invention, however, such coarse particles are not counted in calculation of the average particle diameter. This is because, in most cases, such coarse particles constitute at most 1% of the total number of hollow polymer particles formed and have little effect on the particle diameter distribution of hollow polymer particle which is the essence of the present invention.

One of features of hollow polymer particles in the present invention is that the sum of the number of particles having diameters of 90% or less of an average diameter of the hollow polymer particle and the number of particles having diameters of 110% or more of the average diameter is 40% or more of the total number of hollow polymer particles, and the proportion of hollow polymer particles whose diameters are in the ranges specified above is preferably from 40% to 70%.

Herein, the expressions “the number of particles having diameters of 90% or less of the average diameter” and “the number of particles having diameters of 110% or more of the average diameter” refer to the numbers of particles whose diameters are found to be within the ranges respectively specified above when at least 300 particles are observed under a transmission electron microscope.

The present invention has been made by my finding that, when the presence rate of particles having diameters in those ranges rather deviating from the average value is high, the heat insulation layer can have an improvement in heat insulation quality without attended by lowering of film strength. More specifically, although there is a general tendency of heat insulation property to be enhanced by increasing the presence rate of a hollow polymer particles in the heat insulation layer, the presence rate increase is generally attended with an decrease in associative strength among hollow polymer particles, so the film strength tends to be lowered. On the other hand, the use of a hollow polymer particles having the particle diameter distribution specified by the present invention permits improvement in heat insulation property, unprecedentedly without weakening the film strength. While the lowering of film strength causes a problem linked to image failures traceable to roller imprints developing under transport of an image-receiving sheet, the use of the hollow polymer particles according to the present invention hardly causes such a problem, and can ensure high-quality image formation.

The hollow polymer particles can be prepared to have the particle diameter distribution specified above no matter what method is used. For instance, the particle diameter distribution is adjustable to the desired one by freely changing the aforementioned synthesis conditions (such as the stirring condition, the reaction temperature, the proportions of monomers added and the species of surfactants added during the synthesis), or by freely mixing a plurality of hollow polymer particles having narrow particle diameter distributions.

These hollow polymer particles preferably have a hollow ratio of about 20 to 70%, more preferably 20 to 60%. If the hollow ratio is too low, it may become impossible to obtain a sufficient heat-insulation property, whereas, if the hollow ratio is excessively too large, it may lead increase of the proportion of hollow particles that are imperfect even in the above-described preferable range of particle diameter, which causes it impossible to obtain a sufficient film strength.

The hollow ratio (%) of hollow polymer particles as referred to herein is determined by taking a transmission electron microscope photograph of at least 300 hollow polymer particles, measuring the circle-equivalent diameter of the void in each particle and the diameter of the hollow polymer particle, calculating individual hollow ratios (%) from the measured values according to the following Formula, and averaging the individual hollow ratios:

$$\text{Individual hollow ratio }(\%)=(\text{Circle-equivalent diameter of void})^3/(\text{Diameter of hollow polymer particle})^3\times 100$$

The glass transition temperature (Tg) of the hollow polymer particles is preferably 70° C. or more and more preferably 100° C. or more. These hollow polymer particles may be used in combinations of two or more.

A water-dispersible resin or water-soluble type resin is preferably contained, as a binder, in the heat insulation layer containing the hollow polymer particles. As the binder resin that can be used in the present invention, known resins such as an acryl resin, styrene/acryl copolymer, polystyrene resin, polyvinyl alcohol resin, vinyl acetate resin, ethylene/vinyl acetate copolymer, vinyl chloride/vinyl acetate copolymer, styrene/butadiene copolymer, polyvinylidene chloride resin, cellulose derivative, casein, starch, and gelatin may be used. Also, these resins may be used either singly or as mixtures.

The solid content (ratio of content) of the hollow polymer particles is preferably 60% by mass or more, more preferably 65% by mass or more, and further preferably 65% to 80% by mass, based on the total solid content of the hollow polymer particles and the binder resin. Also, the ratio by mass of the solid content of the hollow polymer particles in the coating solution is preferably 1 to 70% by mass and more preferably 10 to 40% by mass. If the ratio of the hollow polymer particles is excessively low, sufficient heat insulation cannot be obtained, whereas if the ratio of the hollow polymer particles is excessively large, the adhesion between the hollow polymer particles is reduced, and thereby sufficient film strength cannot be obtained, causing deterioration in abrasion resistance.

The heat insulation layer of the heat-sensitive transfer image-receiving sheet of the present invention is free of any resins that are not resistant to an organic solvent, except for the hollow polymer particles. Incorporation of the resin that is not resistant to an organic solvent (resin having a dye-dyeing affinity) in the heat insulation layer is not preferable in view of increase in loss of image definition after image transfer. It is assumed that the color-edge definition loss increases by the reason that owing to the presence of both the resin having a dye-dyeing affinity and the hollow polymer particles in the heat insulation layer, a transferred dye that has dyed the receptor layer migrates through the heat insulation layer adjacent thereto with the lapse of time.

Herein, the term "the resin that is not resistant to an organic solvent" means a resin having solubility in an organic solvent (e.g., methyl ethyl ketone, ethyl acetate, benzene, toluene, xylene) of 1 mass % or more, preferably 0.5 mass % or more. For example, the above-mentioned latex polymer is included in the category of "the resin that is not resistant to an organic solvent".

The heat insulation layer preferably contains the above-mentioned water-soluble polymer. Preferable compounds of the water-soluble polymer are gelatin and polyvinyl alcohol.

An amount of the water-soluble polymer to be added in the heat insulation layer is preferably from 1 to 75 mass %, more preferably from 1 to 50 mass % to the entire heat insulation layer.

The coating amount of the above hollow polymer particles in the heat insulation layer is preferably 1 to 100 g/m$^2$, and more preferably 5 to 20 g/m$^2$.

The heat insulation layer preferably contains a crosslinking agent (compound capable of crosslinking a water-soluble polymer). A part or all of the water-soluble polymer that is contained in the heat insulation layer has been preferably cross-linked with the crosslinking agent. Preferable compounds as well as a preferable amount of the crosslinking agent to be used are the same as mentioned above.

A preferred ratio of a cross-linked water-soluble polymer in the heat insulation layer varies depending on the kind of the crosslinking agent, but the water-soluble polymer in the heat insulation layer is crosslinked by preferably 0.1 to 20 mass %, more preferably 1 to 10 mass %, based on the entire water-soluble polymer.

A thickness of the heat insulation layer containing the hollow polymer particles is preferably from 5 to 50 μm, more preferably from 5 to 40 μm.

A void rate (porosity ratio) of the heat insulation layer, which is calculated from the thickness of the heat insulation layer containing hollow polymer particles and the solid-matter coating amount of the heat insulation layer including the hollow polymer particles, is preferably 10 to 70% and more preferably 15 to 60%. When the void ratio is too low, sufficient heat insulation property cannot be obtained. When the void ratio is too large, the binding force among hollow polymer particles deteriorates, and thus sufficient film strength cannot be obtained, and abrasion resistance deteriorates.

The void ratio of the heat insulation layer as referred to herein is a value V calculated according to the Formula (b) below.

$$V=1-L/L\times\Sigma gi\cdot di \qquad \text{Formula (b)}$$

In Formula (b), L represents the thickness of the heat insulation layer; gi represents the coating amount of a particular material i in terms of solid matter for the heat insulation layer; and di represents the specific density of the particular material i. When di represents the specific density of the hollow polymer particles, di is the specific density of the wall material of hollow polymer particles.

(Undercoat Layer)

An undercoat layer may be formed between the receptor layer and the heat insulation layer. As the undercoat layer, for example, at least one of a white background controlling layer, a charge layer, an adhesive layer and a primer layer is formed. These layers may be formed in the same manner as those described in, for example, each specification of Japanese Patent Nos. 3585599 and 2925244.

(Support)

In the present invention, a waterproof support is preferably used as the support. The use of the waterproof support makes it possible to prevent the support from absorbing moisture, whereby a fluctuation in the performance of the receptor layer with time can be prevented. As the waterproof support, for example, coated paper or laminate paper may be used.

—Coated Paper—

The coated paper is paper obtained by coating a sheet such as base paper with various resins, rubber latexes, or high-molecular materials, on one side or both sides of the sheet, wherein the coating amount differs depending on its use. Examples of such coated paper include art paper, cast coated paper, and Yankee paper.

(A) Polyolefin resins such as polyethylene resin and polypropylene resin; copolymer resins composed of an olefin such as ethylene or propylene and another vinyl unit; and acrylic resins.

(B) Thermoplastic resins having an ester linkage: for example, polyester resins obtained by condensation of a dicarboxylic acid component (such a dicarboxylic acid component may be substituted with a sulfonic acid group, a carboxyl group, or the like) and an alcohol component (such an alcohol component may be substituted with a hydroxyl group, or the like); polyacrylate resins or polymethacrylate resins such as polymethylmethacrylate, polybutylmethacrylate, polymethylacrylate, polybutylacrylate, or the like; polycarbonate resins, polyvinyl acetate resins, styrene acrylate resins, styrene-methacrylate copolymer resins, vinyltoluene acrylate resins, or the like.

Concrete examples of them are those described in JP-A-59-101395, JP-A-63-7971, JP-A-63-7972, JP-A-63-7973, and JP-A-60-294862.

Commercially available thermoplastic resins usable herein are, for example, Vylon 290, Vylon 200, Vylon 280, Vylon 300, Vylon 103, Vylon GK-140, and Vylon GK-130 (products of Toyobo Co., Ltd.); Tafton NE-382, Tafton U-5, ATR-2009, and ATR-2010 (products of Kao Corporation); Elitel UE 3500, UE 3210, XA-8153, KZA-7049, and KZA-1449 (products of Unitika Ltd.); and Polyester TP-220 and R-188 (products of The Nippon Synthetic Chemical Industry Co., Ltd.); and thermoplastic resins in the Hyros series from Seiko Chemical Industries Co., Ltd., and the like (all of these names are trade names).

(C) Polyurethane resins, etc.

(D) Polyamide resins, urea resins, etc.

(E) Polysulfone resins, etc.

(F) Polyvinyl chloride resins, polyvinylidene chloride resins, vinyl chloride/vinyl acetate copolymer resins, vinyl chloride/vinyl propionate copolymer resins, etc.

(G) Polyol resins such as polyvinyl butyral; and cellulose resins such as ethyl cellulose resin and cellulose acetate resin.

(H) Polycaprolactone resins, styrene/maleic anhydride resins, polyacrylonitrile resins, polyether resins, epoxy resins, and phenolic resins.

The thermoplastic resins may be used either alone or in combination of two or more.

The thermoplastic resin may contain a whitener, a conductive agent, a filler, a pigment or dye including, for example, titanium oxide, ultramarine blue, and carbon black; or the like, if necessary.

—Laminated Paper—

The laminated paper is a paper which is formed by laminating various kinds of resin, rubber, polymer sheets or films on a sheet such as a base paper or the like. Specific examples of the materials useable for the lamination include polyolefins, polyvinyl chlorides, polyethylene terephthalates, polystyrenes, polymethacrylates, polycarbonates, polyimides, and triacetylcelluloses. These resins may be used alone, or in combination of two or more.

Generally, the polyolefins are prepared by using a low-density polyethylene. However, for improving the thermal resistance of the support, it is preferred to use a polypropylene, a blend of a polypropylene and a polyethylene, a high-density polyethylene, or a blend of a high-density polyethylene and a low-density polyethylene. From the viewpoint of cost and its suitableness for the laminate, it is preferred to use the blend of a high-density polyethylene and a low-density polyethylene.

The blend of a high-density polyethylene and a low-density polyethylene is preferably used in a blend ratio (a mass ratio) of 1/9 to 9/1, more preferably 2/8 to 8/2, and most preferably 3/7 to 7/3. When the thermoplastic resin layer is formed on the both surfaces of the support, the back side of the support is preferably formed using, for example, the high-density polyethylene or the blend of a high-density polyethylene and a low-density polyethylene. The molecular weight of the polyethylenes is not particularly limited. Preferably, both of the high-density polyethylene and the low-density polyethylene have a melt index of 1.0 to 40 g/10 minute and a high extrudability.

The sheet or film may be subjected to a treatment to impart white reflection thereto. As a method of such a treatment, for example, a method of incorporating a pigment such as titanium oxide into the sheet or film can be mentioned.

The support that can be used in the present invention preferably has a base paper (base sheet) and a polyolefin resin layer that is provided on both side or at least on the side of the base paper to which the receptor layer is provided. The thickness of the support is preferably from 25 μm to 300 μm, more preferably from 50 μm to 260 μm, and further preferably from 75 μm to 220 μm. The support can have any rigidity according to the purpose. When it is used as a support for electrophotographic image-receiving sheet of photographic image quality, the rigidity thereof is preferably near to that in a support for use in color silver halide photography.

(Curling Control Layer)

When the support is exposed as it is, there is the case where the heat-sensitive transfer image-receiving sheet is made to curl by moisture and/or temperature in the environment. It is therefore preferable to form a curling control layer on the backside of the support. The curling control layer not only prevents the image-receiving sheet from curling but also has a water-proof function. For the curling control layer, a polyethylene laminate, a polypropylene laminate or the like is used. Specifically, the curling control layer may be formed in the same manner as described in, for example, JP-A-61-110135 and JP-A-6-202295.

(Writing Layer and Charge Controlling Layer)

For the writing layer and the charge control layer, an inorganic oxide colloid, an ionic polymer, or the like may be used. As the antistatic agent, any antistatic agents including cationic antistatic agents such as a quaternary ammonium salt and polyamine derivative, anionic antistatic agents such as alkyl phosphate, and nonionic antistatic agents such as fatty acid ester may be used. Specifically, the writing layer and the charge control layer may be formed in the same manner as described in the specification of Japanese Patent No. 3585585.

The method of producing the heat-sensitive transfer image-receiving sheet of the present invention is explained below.

The heat-sensitive transfer image-receiving sheet of the present invention can be preferably formed, by applying at least one receptor layer, a heat insulation layer and, if necessary one undercoat layer, on a support, through simultaneous multi-layer coating. In the present invention, it is preferable to form at least one receptor layer and at least one heat insulation layer, on a support, by applying at least one receptor layer coating solution containing the latex polymer and at least one heat-insulation-layer coating solution containing hollow polymer particles but not containing a resin that is not resistant to an organic solvent (the resin does not embrace the hollow polymer particles) with a simultaneous multilayer coating.

The heat-sensitive transfer image-receiving sheet of the present invention can be preferably formed by applying at least one receptor layer, a heat insulation layer and, if necessary one undercoat layer, on a support through simultaneous multi-layer coating.

It is known that in the case of producing an image-receiving sheet composed of plural layers having different functions from each other (for example, an air cell layer, a heat insulation layer, an intermediate layer and a receptor layer) on a support, it may be produced by applying and overlapping each layer one by one or by applying materials prepared in advance by coating a support with each layer, as shown in, for example, JP-A-2004-106283, JP-A-2004-181888 and JP-A-2004-345267. It has been known in photographic industries, on the other hand, that productivity can be greatly improved by applying plural layers simultaneously as a multilayer. For example, there are known methods such as the so-called slide coating (slide coating method) and curtain coating (curtain coating method) as described in, for example, U.S. Pat. Nos. 2,761,791, 2,681,234, 3,508,947, 4,457,256 and 3,993,019; JP-A-63-54975, JP-A-61-278848, JP-A-55-86557, JP-A-52-31727, JP-A-55-142565, JP-A-50-43140, JP-A-63-80872, JP-A-54-54020, JP-A-5-104061, JP-A-5-127305, and JP-B-49-7050; Edgar B. Gutoff, et al., "Coating and Drying Defects: Troubleshooting Operating Problems", John Wiley & Sons Company, 1995, pp. 101-103; and "LIQUID FILM COATING", pp. 401 to 536 (Chapman & Hall, 1997).

In the present invention, it has been found that the productivity is greatly improved and at the same time image defects can be remarkably reduced, by using the above simultaneous multilayer coating for the production of an image-receiving sheet having a multilayer structure.

The plural layers in the present invention are structured using resins as its major components. Coating solutions forming each layer are preferably water-dispersible latexes. The solid content by mass of the resin put in a latex state in each layer coating solution is preferably in a range from 5 to 80% and particularly preferably 20 to 60%. The average particle size of the resin contained in the above water-dispersed latex is preferably 5 μm or less and particularly preferably 1 μm or less. The above water-dispersed latex may contain a known additive, such as a surfactant, a dispersant, and a binder resin, according to the need.

In the present invention, it is preferred that a laminate composed of plural layers be formed on a support and solidified just after the forming, according to the method described in U.S. Pat. No. 2,761,791. For example, in the case of solidifying a multilayer structure by using a resin, it is preferable to raise the temperature immediately after the plural layers are formed on the support. Also, in the case where a binder (e.g., a gelatin) to be gelled at lower temperatures is contained, there is the case where it is preferable to drop the temperature immediately after the plural layers are formed on the support.

In the present invention, the coating amount of a coating solution per one layer constituting the multilayer is preferably in a range from 1 g/m$^2$ to 500 g/m$^2$. The number of layers in the multilayer structure may be arbitrarily selected from a number of 2 or more. The receptor layer is preferably disposed as a layer most apart from the support.

A heat-sensitive transfer sheet (ink sheet) used in combination with the heat-sensitive transfer image-receiving sheet according to the present invention as mentioned above at the time of formation of heat transfer image is preferably a sheet having on a support a dye layer containing a diffusion-transfer dye, and any ink sheet can be used as the sheet. As a means for providing heat energy in the thermal transfer, any of the conventionally known providing means may be used. For example, application of a heat energy of about 5 to 100 $mJ/mm^2$ by controlling recording time in a recording device such as a thermal printer (trade name: Video Printer VY-100, manufactured by Hitachi, Ltd.), sufficiently attains the expected result.

Also, the heat-sensitive transfer image-receiving sheet of the present invention may be used in various applications enabling thermal transfer recording, such as heat-sensitive transfer image-receiving sheets in a form of thin sheets (cut sheets) or rolls; cards; and transmittable type manuscript-making sheets, by optionally selecting the type of support.

The present invention can be applied to a printer, a copying machine and the like, each of which uses a heat-sensitive transfer recording system.

Advantageously, the heat-sensitive transfer image-receiving sheet of the present invention gives a high-quality image without image defect at higher density at lower production cost.

EXAMPLES

The present invention will be described in more detail based on the following examples, but the invention is not intended to be limited thereto. In the following Examples, the terms "part" and "%" are values by mass, unless they are indicated differently in particular.

(Preparation of Ink Sheet)

A polyester film 6.0 μm in thickness (trade name: Lumirror, manufactured by Toray Industries, Inc.) was used as the substrate film. A heat-resistant slip layer (thickness: 1 μm) was formed on the back side of the film, and the following yellow, magenta, and cyan compositions were respectively applied as a monochromatic layer (coating amount: 1 $g/m^2$ after drying) on the front side.

| Yellow composition | |
|---|---|
| Dye (trade name: Macrolex Yellow 6G, manufactured by Bayer) | 5.5 parts by mass |
| Polyvinylbutyral resin (trade name: ESLEC BX-1, manufactured by Sekisui Chemical Co., Ltd.) | 4.5 parts by mass |
| Methyl ethyl ketone/toluene (1/1, at mass ratio) | 90 parts by mass |
| **Magenta composition** | |
| Magenta dye (trade name; Disperse Red 60) | 5.5 parts by mass |
| Polyvinylbutyral resin (trade name: ESLEC BX-1, manufactured by Sekisui Chemical Co., Ltd.) | 4.5 parts by mass |
| Methyl ethyl ketone/toluene (1/1, at mass ratio) | 90 parts by mass |
| **Cyan composition** | |
| Cyan dye (Solvent Blue 63) | 5.5 parts by mass |
| Polyvinylbutyral resin (trade name: ESLEC BX-1, manufactured by Sekisui Chemical Co., Ltd.) | 4.5 parts by mass |
| Methyl ethyl ketone/toluene (1/1, at mass ratio) | 90 parts by mass |

(Preparation of Image-Receiving Sheet)

(Preparation of Support)

A pulp slurry was prepared from 50 parts by mass of hardwood bleach kraft pulp (LBKP) of acacia origin and 50 parts by mass of hardwood bleach kraft pulp (LBKP) of aspen origin, by beating these pulps by means of a disk refiner until Canadian standard freeness reached to 300 ml.

To the pulp slurry thus prepared were added, on a pulp basis, 1.3 mass % of modified cationic starch (CAT0304L, trade name, manufactured by Nippon NSC), 0.15 mass % of anionic polyacrylamide (DA4104, trade name, manufactured by Seiko PMC Corporation), 0.29 mass % of an alkylketene dimer (SIZEPINE K, trade name, manufactured by Arakawa Chemical Industries, Ltd.), 0.29 mass % of epoxidated behenic acid amide, and 0.32 mass % of polyamide polyamine epichlorohydrin (ARAFIX 100, trade name, manufactured by Arakawa Chemical Industries, Ltd.), and thereafter 0.12 mass % of a defoaming agent was further added.

The resulting pulp slurry was made into paper by use of a fourdrinier paper machine. In a process of drying in which the felt side of web was pressed against a drum dryer cylinder via a dryer canvas, the web thus formed was dried under a condition that the tensile strength of the dryer canvas was adjusted to 1.6 kg/cm. Then, each side of the raw paper thus made was coated with 1 $g/m^2$ of polyvinyl alcohol (KL-118, trade name, manufactured by Kuraray Co., Ltd.) with a size press, then, dried and further subjected to calendering treatment. Therein, the papermaking was performed so that the raw paper had a grammage (basis weight) of 157 $g/m^2$, and the raw paper (base paper) having a thickness of 160 μm was obtained.

The wire side (back side) of the base paper obtained was subjected to corona discharge treatment, and thereto a resin composition, in which a high-density polyethylene having an MFR (which stands for a melt flow rate, and hereinafter has the same meaning) of 16.0 g/10 min and a density of 0.96 $g/cm^3$ (containing 250 ppm of hydrotalcite (DHT-4A (trade name), manufactured by Kyowa Chemical Industry Co., Ltd.) and 200 ppm of a secondary antioxidant (tris(2,4-di-t-butylphenyl)phosphite, Irugaphos 168 (trade name), manufactured by Ciba Specialty Chemicals)) and a low-density polyethylene having an MFR of 4.0 g/10 min and a density of 0.93 $g/cm^3$ were mixed at a ratio of 75 to 25 by mass, was applied so as to have a thickness of 21 $g/m^2$, by means of a melt extruder, thereby forming a thermoplastic resin layer with a mat surface. (The side to which this thermoplastic resin layer was provided is hereinafter referred to as "back side"). The thermoplastic resin layer at the back side was further subjected to corona discharge treatment, and then coated with a dispersion prepared by dispersing into water a 1:2 mixture (by mass) of aluminum oxide (ALUMINASOL 100, trade name, manufactured by Nissan Chemical Industries, Ltd.) and silicon dioxide (SNOWTEX 0, trade name, manufactured by Nissan Chemical Industries, Ltd.), as an antistatic agent, so that the coating had a dry mass of 0.2 $g/m^2$. Subsequently, the front surface (front side) of the base paper was subjected to corona discharge treatment, and then coated with 27 $g/m^2$ of a low-density polyethylene having an MFR of 4.0 g/10 min and a density of 0.93 $g/m^2$ and containing 10 mass % of titanium oxide, by means of a melt extruder, thereby forming a thermoplastic resin layer with a specular surface.

(Preparation of Emulsified Dispersion)

An emulsified dispersion A was prepared in the following manner. An antioxidizing agent (EB-9) was dissolved in a mixture of 42 g of a high-boiling solvent (Solv-5) and 20 ml of ethyl acetate, and the resulting solution was emulsified and dispersed in 250 g of a 20 mass % aqueous gelatin solution containing 1 g of sodium dodecylbenzenesulfonate by means of a high-speed stirring emulsification machine (dissolver). Thereto, water was added to prepare 380 g of an emulsified dispersion A. Therein, the addition amount of the antioxidizing agent (EB-9) was adjusted so that the antioxidizing agent would be contained in an amount of 30 mol % in the emulsified dispersion A.

(Preparation of Hollow Polymer Particles (1))

Six parts of a monomer mixture (a) consisting of 50% methyl methacrylate (MMA), 5% butyl acrylate (BA) and 45% methacrylic acid (MAA), 0.03 part of sodium dodecylbenzenesulfonate (DBSN), and 48 parts of ion-exchange water were mixed and stirred to prepare an emulsion (A); separately, 25 parts of a monomer mixture (b) consisting of 78% MMA and 22% BA for forming the intermediate layer, 0.075 part of DBSN and 35 parts of ion-exchange water were mixed and stirred to prepare an emulsion (B); and 75 parts of styrene, 0.075 part of DBSN, and 33 parts of ion-exchange water were mixed to prepare an emulsion (C).

Then, 17 parts of ion-exchange water and 0.5 parts by weight of an acrylic seed latex solution having a particle diameter of 35 nm at a solid matter concentration of 12% were placed in a reactor equipped with a stirrer, a reflux condenser tube, a thermometer, and a separatory funnel, and the mixture was heated to 80° C.

Then, 1 part of 3% potassium persulfate (KPS) solution was added from the separatory funnel; the emulsion (A) was added over a period of 4 hours; and the mixture was kept at 80° C. additionally for 1 hour. Subsequently, 256 parts of ion-exchange water and 3.5 parts of 3% aqueous KPS solution were added, and the emulsion (B) was added over 2 hours.

After addition, the mixture was heated to 85° C.; 3.5 parts of 3% aqueous KPS solution was added, and then, half of the emulsion (C) was added over 1.5 hours. After addition, the mixture was allowed to react at 85° C. for 1 hour.

Subsequently, 10 parts of 10% sodium hydroxide solution was added from the separatory funnel; the mixture was kept at 85° C. for 30 minutes and treated with a base; 33 parts of 3% aqueous KPS solution was added thereto; and the other half of the emulsion (C) was added over 1.5 hours. The mixture was then allowed to polymerize additionally for 2 hours and then concentrated in an evaporator to a solid matter content of 30% to give a hollow polymer particles (1).

The hollow polymer particles (I) obtained had an average diameter of 450 nm and a hollow ratio of 21%. The content of particles (smaller particle ratio) at a size of 90% or less of the average diameter was 25%, while that of the particles (larger particle ratio) at a size of 110% or more of the average diameter was 12%.

(Preparation of Hollow Polymer Particles (2))

A hollow polymer particles (2) was prepared in the same manner as the polymer particles (1), except that ethyl acrylate (EA) was added in place of MMA as a constituent of the emulsion (A).

The hollow polymer particles (2) obtained had an average particle diameter of 510 nm and a hollow ratio of 33%. The content of particles (smaller particle ratio) at a size of 90% or less of the average diameter was 21%, while that of the particles (larger particle ratio) at a size of 110% or more of the average diameter was 12%.

(Preparation of Hollow Polymer Particles (3))

A hollow polymer particles (3) was prepared by mixing 20 parts by mass of the hollow polymer particles (1) and 80 parts by mass of the hollow polymer particles (2).

The hollow polymer particles obtained had an average particle diameter of 500 nm and a hollow ratio of 31%. The content of particles at a size of 90% or less of the average diameter was 25%, while that of the particles at a size of 110% or more of the average diameter was 16%. The particles having sizes of at most 90% of the average particle diameter and the particles having sizes of at least 110% of the average particle diameter were present in a total proportion of 41%.

(Preparation of Hollow Polymer Particles (4))

A hollow polymer particles (4) was prepared by mixing 40 parts by mass of the hollow polymer particles (1) and 60 parts by mass of the hollow polymer particles (2).

The hollow polymer particles obtained had an average particle diameter of 485 nm and a hollow ratio of 28%. The content of particles at a size of 90% or less of the average diameter was 27%, while that of the particles at a size of 110% or more of the average diameter was 18%. The particles having sizes of at most 90% of the average particle diameter and the particles having sizes of at least 110% of the average particle diameter were present in a total proportion of 45%.

(Preparation of Image-Receiving Sheet)

Image-receiving sheet (1-1) was prepared on the support prepared in the foregoing manner so as to form a multiple-layer structure having a subbing (undercoat) layer 1, a subbing layer 2, a heat insulation layer, and a receptor layer, in increasing order of distance from the support. Compositions and application amounts of the coating solutions used herein are shown below.

Simultaneous multi-layer coating was carried out according to the slide coating method described in "LIQUID FILM COATING" p. 427, as a coating method, and the solutions after coating were conveyed through a set zone at 6° C. for 30 seconds to lose the solution fluidity, and then, the sheet was dried by spraying drying air at 22° C. and 45% RH on the coated surface for 2 minutes.

| | |
|---|---|
| **Coating solution for subbing layer 1 (Composition)** | |
| Aqueous solution prepared by adding 1% sodium dodecylbenzenesulfonate to 3% aqueous gelatin solution | |
| NaOH for adjusting pH to 8 | |
| (Coating amount) | 11 ml/$m^2$ |
| **Coating solution for subbing layer 2 (Composition)** | |
| Styrene-butadiene latex (SR103 (trade name), manufactured by Nippon A & L Inc.) | 60 parts by mass |
| 6% Aqueous solution of polyvinyl alcohol (PVA) | 40 parts by mass |
| NaOH for adjusting pH to 8 | |
| (Coating amount) | 11 ml/$m^2$ |
| **Coating solution for heat insulation layer (Composition)** | |
| Hollow polymer particles (1) | 60 parts by mass |
| 10% Gelatin aqueous solution | 60 parts by mass |
| NaOH for adjusting pH to 8 | |
| Water | 5 parts by mass |
| (Coating amount) | 50 ml/$m^2$ |
| **Coating solution for receptor layer (Composition)** | |
| Vinyl chloride-latex polymer (VINYBLAN 900 (trade name), manufactured by Nissin Chemical Industry Co., Ltd.) | 50 parts by mass |

-continued

| | |
|---|---|
| Vinyl chloride-latex polymer (VINYBLAN 276 (trade name), manufactured by Nissin Chemical Industry Co., Ltd.) | 20 parts by mass |
| 10% Gelatin aqueous solution | 10 parts by mass |
| Emulsified dispersion A prepared in the above | 10 parts by mass |
| Microcrystalline wax (EMUSTAR-42X (trade name), manufactured by Nippon Seiro Co., Ltd.) | 5 parts by mass |

-continued

| | |
|---|---|
| Water | 5 parts by mass |
| NaOH for adjusting pH to 8 | |
| (Coating amount) | 18 ml/$m^2$ |

Further, image-receiving sheets (1-2) to (5-4) were prepared in the same manner as the image-receiving sheet, except that the coating solution for heat insulation layer were replaced according to Table 1.

TABLE 1

| | (1-1) | (1-2) | (1-3) | (1-4) | (2-1) | (2-2) | (2-3) | (2-4) | (3-1) | (3-2) | (3-3) | (3-4) |
|---|---|---|---|---|---|---|---|---|---|---|---|---|
| Hollow polymer particles | (1) | | | | (2) | | | | (3) | | | |
| Amount | 60 parts | | | | 60 parts | | | | 60 parts | | | |
| Water-soluble polymer | 10% Gelatin aqueous solution | | | | 10% Gelatin aqueous solution | | | | 10% Gelatin aqueous solution | | | |
| Amount | 60 parts | 77 parts | 97 parts | 120 parts | 60 parts | 77 parts | 97 parts | 120 parts | 60 parts | 77 parts | 97 parts | 120 parts |
| Water | 285 parts | 290 parts | 295 parts | 300 parts | 285 parts | 290 parts | 295 parts | 300 parts | 285 parts | 290 parts | 295 parts | 300 parts |
| Content of hollow polymer particles | 75% | 70% | 65% | 60% | 75% | 70% | 65% | 60% | 75% | 70% | 65% | 60% |
| Smaller particle ratio | 25% | | | | 21% | | | | 25% | | | |
| Larger particle ratio | 12% | | | | 12% | | | | 16% | | | |
| Σ (total) | 37% | | | | 33% | | | | 41% | | | |
| Remarks | Comparative example | | | | Comparative example | | | | This invention | | | |
| Dm | 2.10 | 2.02 | 1.90 | 1.75 | 2.18 | 2.18 | 2.10 | 1.90 | 2.17 | 2.17 | 2.08 | 1.87 |
| Evaluation | ○ | X | X | X | ○ | ○ | ○ | X | ○ | ○ | ○ | X |
| Marks for roller imprints | 6 | 5 | 3 | 2 | 7 | 6 | 5 | 2 | 4 | 3 | 3 | 2 |
| Evaluation | X | X | ○ | ○ | X | X | X | ○ | Δ | ○ | ○ | ○ |
| Total evaluation | X | X | X | X | X | X | X | X | Δ | ○ | ○ | X |

| | (4-1) | (4-2) | (4-3) | (4-4) | (5-1) | (5-2) | (5-3) | (5-4) |
|---|---|---|---|---|---|---|---|---|
| Hollow polymer particles | (4) | | | | (5) | | | |
| Amount | 60 parts | | | | 60 parts | | | |
| Water-soluble polymer | 10% Gelatin aqueous solution | | | | 8% Gelatin and 2% PVA117 aqueous solution | | | |
| Amount | 60 parts | 77 parts | 97 parts | 120 parts | 60 parts | 77 parts | 97 parts | 120 parts |
| Water | 285 parts | 290 parts | 295 parts | 300 parts | 285 parts | 290 parts | 295 parts | 300 parts |
| Content of hollow polymer particles | 75% | 70% | 65% | 60% | 75% | 70% | 65% | 60% |
| Smaller particle ratio | 27% | | | | 27% | | | |
| Larger particle ratio | 18% | | | | 18% | | | |
| Σ (total) | 45% | | | | 45% | | | |
| Remarks | This invention | | | | This invention | | | |
| Dm | 2.17 | 2.14 | 2.04 | 1.82 | 2.20 | 2.15 | 2.06 | 1.90 |
| Evaluation | ○ | ○ | Δ | X | ○ | ○ | Δ | X |
| Marks for roller imprints | 3 | 3 | 2 | 1 | 3 | 3 | 2 | 1 |
| Evaluation | ○ | ○ | ○ | ○ | ○ | ○ | ○ | ○ |
| Total evaluation | ○ | ○ | Δ | X | ○ | ○ | Δ | X |

PVA-117: A product of Kuraray Co., Ltd.

Dm: Magenta density of the image output by a signal of (R, G, B) = (0, 0, 0)

Marks for roller imprints assigned in evaluation of gray solid images of D = 1.0 output to ASK-2000 by sensory testing. A mark of 7 indicates the worst, and a mark of 0 the best.

Evaluation

○: Of merchandising value

Δ: Acceptable as commodity

X: Lacking in merchandising value (Image Formation)

A solid image of a signal (R,G,B) of (0,0,0) was formed by using the ink and the image-receiving sheet described above and a thermal transfer printer ASK-2000 (manufactured by Fuji Photo Film Co.), and the reflection density from the image was determined. As typical value thereof, magenta density Dm, is shown in Table 1. Gray solid images of D=1.0 were formed as images for evaluation of roller imprints. The evaluation results are tabulated in Table 1.

As is apparent from the results shown in Table 1, the image-receiving sheets (3-1) to (5-4) having heat insulation layers formed by using hollow polymer particles having particle diameter distributions that the sum of the number of particles having diameters of at most 90% of an average diameter and the number of particles having diameters of at least 110% of the average diameter constituted at least 40% of the total number of hollow polymer particles, though their Dms and marks for roller imprints varied with contents of hollow polymer particles in the heat insulation layers, offered significantly high merchandising values over wide ranges in comparison with the image-receiving sheets (1-1) to (2-4) using hollow polymer particles which do not satisfy the requirements of the present invention.

Furthermore, it has been found that, when contents of hollow polymer particles in heat insulation layers were 65 mass % or more, the heat insulation layers showed higher heat insulation and ensured higher-quality images free of roller imprints so long as the average diameters of hollow polymer particles present in such heat insulation layers were 0.45 μm or more.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2006-182402 filed in Japan on Jun. 30, 2006, which is entirely herein incorporated by reference.

What I claim is:

1. A heat-sensitive transfer image-receiving sheet, comprising;

a support;

at least one receptor layer on a support, said at least one receptor layer containing at least one of a vinyl chloride/vinyl acetate latex copolymer and a vinyl chloride/acrylate latex copolymer;

at least one heat insulation layer containing hollow latex polymer particles having an average diameter of from 0.3 to 1.5 μm, said at least one heat insulation layer being provided between the support and the at least one receptor layer; and wherein the hollow polymer particles have a particle diameter distribution that a sum of the number of particles having diameters of 90% or less of an average diameter of the hollow polymer particles and the number of particles having diameters of 110% or more of the average diameter is at least 40% of the total number of the hollow polymer particles present in the heat insulation layer.

2. The heat-sensitive transfer image-receiving sheet according to claim 1, wherein the hollow polymer particles are non-foaming hollow particles obtained in the following manner: a dispersion medium is contained inside of a capsule wall and, after a coating solution is applied and dried, the dispersion medium in the particles is vaporized out of the particles, so that the inside of each particle forms a hollow.

3. The heat-sensitive transfer image-receiving sheet according to claim 1, wherein the heat insulation layer further contains a water-soluble polymer.

4. The heat-sensitive transfer image-receiving sheet according to claim 3, wherein the water-soluble polymer is a gelatin and/or a polyvinyl alcohol.

5. The heat-sensitive transfer image-receiving sheet according to claim 1, in which the heat insulation layer has a hollow polymer content of 65 mass % or more.

6. The heat-sensitive transfer image-receiving sheet according to claim 1, in which the average diameter of the hollow polymer particles is from 0.45 to 1.5 μm.

7. The heat-sensitive transfer image-receiving sheet according to claim 1, wherein the receptor layer and the heat insulation layer are provided in a simultaneous multilayer coating.

8. The heat-sensitive transfer image-receiving sheet according to claim 1, wherein the support comprises a base paper and a polyolefin resin layer that is provided on both side or at least on the side of the base paper to which the receptor layer is provided.

9. A method of forming an image, which method comprises the steps of:

superposing the heat-sensitive transfer image-receiving sheet according to claim 1 upon a transfer material comprising a solid-phase ink layer, and applying a thermal energy from a thermal head of a thermal transfer printer, and forming an image on the receptor layer in the heat-sensitive transfer image-receiving sheet.

10. The heat-sensitive transfer image-receiving sheet according to claim 1, wherein the at least one heat insulation layer contains at least two kinds of water-soluble polymers.

11. The heat-sensitive transfer image-receiving sheet according to claim 1, wherein said at least one receptor layer contains at least two kinds of latex polymers.

12. The heat-sensitive transfer image-receiving sheet according to claim 1, wherein said at least one receptor layer contains at least one kind of wax dispersion.

13. The heat-sensitive transfer image-receiving sheet according to claim 1, wherein the receptor layer comprising the latex copolymer is a layer most apart from the support.

14. The heat-sensitive transfer image-receiving sheet according to claim 1, wherein at least one of the latex copolymers contained in the receptor layer has a glass transition temperature (Tg) of 0° C. to 80° C.

15. The heat-sensitive transfer image-receiving sheet according to claim 1, wherein the receptor layer containing the latex copolymer includes at least two kinds of latex copolymers each of which has repeating units derived from vinyl chloride.

* * * * *